United States Patent
Kawashita et al.

(10) Patent No.: US 8,816,506 B2
(45) Date of Patent: Aug. 26, 2014

(54) SEMICONDUCTOR DEVICE AND METHOD OF MANUFACTURING THE SAME

(75) Inventors: Michihiro Kawashita, Hitachinaka (JP);
Yasuhiro Yoshimura, Kasumigaura (JP);
Naotaka Tanaka, Kasumigaura (JP);
Takahiro Naito, Duesseldorf (DE);
Takashi Akazawa, Musashimurayama (JP)

(73) Assignee: Tessera Advanced Technologies, Inc., San Jose, CA (US)

( * ) Notice: Subject to any disclaimer, the term of this patent is extended or adjusted under 35 U.S.C. 154(b) by 257 days.

(21) Appl. No.: 13/340,165

(22) Filed: Dec. 29, 2011

(65) Prior Publication Data

US 2012/0091583 A1    Apr. 19, 2012

Related U.S. Application Data

(63) Continuation of application No. 12/640,766, filed on Dec. 17, 2009, now Pat. No. 8,106,518.

(30) Foreign Application Priority Data

Dec. 19, 2008 (JP) ................. 2008-323581

(51) Int. Cl.
*H01L 23/48* (2006.01)
*H01L 23/52* (2006.01)
(52) U.S. Cl.
USPC ............... 257/774; 257/734; 257/E23.067
(58) Field of Classification Search
USPC ......... 257/734, 735, 737, 774, 775, 777, 780, 257/E23.011, E23.067
See application file for complete search history.

(56) References Cited

U.S. PATENT DOCUMENTS

| | | | |
|---|---|---|---|
| 5,973,396 A | 10/1999 | Farnworth | |
| 6,168,969 B1 | 1/2001 | Farnworth | |
| 6,703,310 B2 * | 3/2004 | Mashino et al. | 438/666 |
| 6,912,078 B2 * | 6/2005 | Kudrle et al. | 359/224.1 |
| 6,961,111 B1 | 11/2005 | Kuramasu | |
| 7,276,794 B2 | 10/2007 | Wilner | |
| 7,777,323 B2 * | 8/2010 | Kwon et al. | 257/686 |
| 2004/0188824 A1 * | 9/2004 | Akram et al. | 257/698 |
| 2004/0217441 A1 * | 11/2004 | Lehmann et al. | 257/530 |
| 2005/0221601 A1 * | 10/2005 | Kawano | 438/622 |

(Continued)

FOREIGN PATENT DOCUMENTS

| | | |
|---|---|---|
| JP | 2000-260934 | 9/2000 |
| JP | 2006041148 | 2/2006 |
| JP | 2007-053149 | 3/2007 |
| JP | 2007-073919 | 3/2007 |

*Primary Examiner* — Angel Roman
(74) *Attorney, Agent, or Firm* — Haynes and Boone, LLP

(57) ABSTRACT

In a semiconductor device in which a plurality of semiconductor chips are stacked, performance is enhanced without deteriorating productivity. The semiconductor device has a plurality of elements, an interlayer insulating film, a pad, and a bump electrode electrically connected with the pad sequentially formed on a main surface of a silicon substrate and has a back-surface electrode formed on a back surface of the silicon substrate and electrically connected with the bump electrode. The bump electrode has a protruding portion penetrating through the pad and protruding toward the silicon substrate side. The back-surface electrode is formed so as to reach the protruding portion of the bump electrode from the back surface side of the silicon substrate toward the main surface side and to cover the inside of a back-surface electrode hole portion which does not reach the pad, so that the back-surface electrode is electrically connected with the bump electrode.

19 Claims, 27 Drawing Sheets

(56) References Cited

U.S. PATENT DOCUMENTS

| | | | |
|---|---|---|---|
| 2007/0145518 A1* | 6/2007 | Mihara | 257/499 |
| 2007/0158839 A1* | 7/2007 | Trezza | 257/734 |
| 2007/0190692 A1 | 8/2007 | Erturk et al. | |
| 2008/0036061 A1 | 2/2008 | Chainer | |
| 2008/0230912 A1* | 9/2008 | Lee et al. | 257/758 |
| 2010/0032764 A1 | 2/2010 | Andry et al. | |

\* cited by examiner

FIG. 49A
FIG. 49B
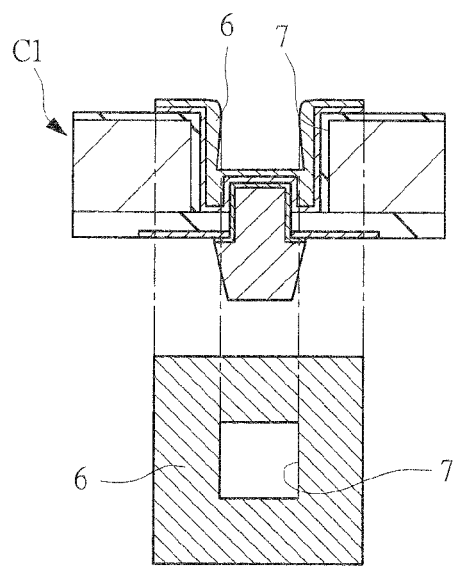
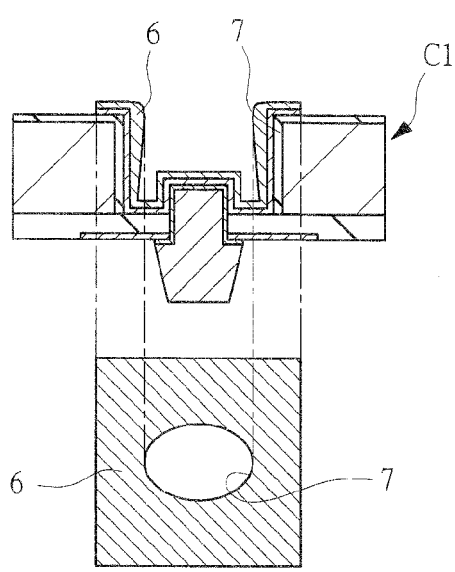
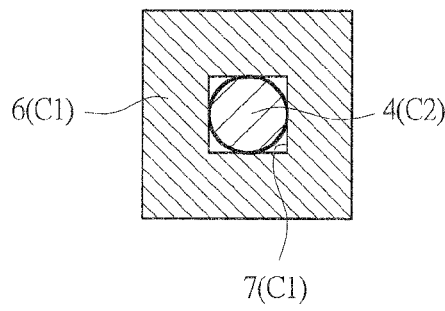
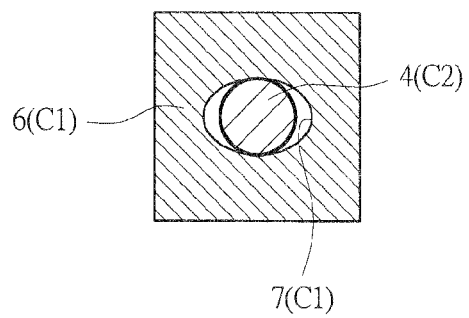

SEMICONDUCTOR DEVICE AND METHOD OF MANUFACTURING THE SAME

CROSS-REFERENCE TO RELATED APPLICATION

The present application claims priority from Japanese Patent Application No. 2008-323581 filed on Dec. 19, 2008, and is a continuation application of U.S. application Ser. No. 12/640,766, filed Dec. 17, 2009, now U.S. Pat. No. 8,106,518 the contents of which are hereby incorporated by reference into this application.

TECHNICAL FIELD OF THE INVENTION

The present invention relates to a semiconductor device and techniques of manufacturing the same and, particularly, relates to techniques effectively applied to a semiconductor device having a structure in which a plurality of semiconductor chips are stacked.

BACKGROUND OF THE INVENTION

In mobile devices such as mobile phones and digital cameras, SiP (System in Package) in which a plurality of chips are stacked and mounted in a semiconductor package is widely used. When the chips are disposed in the manner that they are stacked, the mounting area can be reduced compared with the case in which they are horizontally disposed. Moreover, a large number of chips can be mounted in the same mounting area. However, when the chips are mutually connected by bonding wires, the wiring space for once suspending the bonding wires is needed in a chip peripheral region, and thus the mounting area becomes larger than the chip size. Moreover, there are problems that resistance and inductance are increased as the bonding wires are long and that this is not suitable for high-speed operations.

In order to solve these problems, development of silicon through-electrode techniques for directly connecting chips by forming electrodes which penetrate through the inside of the chips is underway. In this structure in which the chips are mutually and directly connected, the wiring space is not needed in the chip peripheral part, and the space of the mounting area thereof can be reduced. Furthermore, since the inter-chip wiring is the shortest, the wiring resistance and inductance can be suppressed low, and high-speed operations can be carried out.

For example, Japanese Patent Application Laid-Open Publication No. 2000-260934 reports the technique in which, after forming through-holes in chips, through-electrodes are formed by embedding solder or a low-melting-point metal by electrolytic or electroless plating method, and the chips are mutually connected by melting the embedded metal by heating.

Moreover, for example, Japanese Patent Application Laid-Open Publication No. 2007-53149 reports the technique in which a bump formed on an upper chip is pressed against a hollow through-electrode formed in a lower chip to cause the bump and the through-electrode to undergo plastic deformation, so that the bump and the through-electrode are physically caulked so as to mutually connect the chips.

Conceivable methods of forming the above-described bump include a stud bump method and a plating bump method. For example, Japanese Patent Application Laid-Open Publication No. 2007-73919 discloses a method of forming a bump having a sharp end by the plating bump method. Such bump has a high deformability and is suitable for the inter-chip connection technique described in the above-mentioned Patent Document 2.

In the technique of the above-mentioned Patent Document 2 studied by the inventors of the present invention, the through-electrode is formed from a back surface of a semiconductor wafer after semiconductor elements, multi-layer wirings, and bonding pads are formed on a main surface of the semiconductor wafer. When the through-electrode is formed at the end in this manner, the influence on the device caused by particles and contamination generated upon formation of the through-electrode can be reduced, and the designing and manufacturing processes of the device and multi-layer wiring are not required to be changed. Moreover, there is also a big advantage that the through-electrode can be treated as a part of the packaging technique, for example, the through-electrode can be manufactured even in an existing product chip for which inter-chip wiring by wire bonding is expected.

On the other hand, in order to electrically connect the device, which is formed on the semiconductor wafer main surface, and the through-electrode to each other, the through-electrode and a bonding pad have to be electrically connected to each other. The bonding pad is disposed on the surface of an interlayer insulating film. In order to form the through-electrode from the back surface, a hole which penetrates through the silicon substrate part and the interlayer insulating film and stops at the bonding pad surface is formed. The through-electrode can be formed in this manner.

However, according to further studies carried out by the present inventors about the method of forming the through-electrode described above, it has been found out that the method has below problems. When a hole is to be formed from the back surface of the silicon substrate in order to form the through-electrode, as the processability of the interlayer insulating film per se, which is positioned in a lower layer, is low and the part disposed on the bottom surface of a deep hole formed in the silicon substrate is to be processed, etching species does not readily enter. Furthermore, the etching has to be stopped at the point it reaches the thin bonding pad.

As a technical trend of the future, it is conceivable that the degree of integration of the devices mounted on semiconductor devices will be increased and that the number of the through-electrodes formed per one chip will be increased. As a result, the through-electrode will have a small diameter and a high aspect ratio. Given such background, it has been found out that it would be difficult to form the hole portion for the through-electrode only by the back-surface processing. The difficulty of processing the through-electrode and the need for higher processing techniques are the cause that lowers the productivity of above-mentioned high-performance semiconductor devices.

SUMMARY OF THE INVENTION

Accordingly, a preferred aim of the present invention is to provide a technique that enhances performance of a semiconductor device, in which a plurality of semiconductor chips are stacked, without deteriorating the productivity.

The above and other preferred aims and novel characteristics of the present invention will be apparent from the description of the present specification and the accompanying drawings.

The present application discloses a plurality of inventions, and a summary of an embodiment among them will be simply described below.

A semiconductor device has a plurality of elements formed on a first main surface of a semiconductor substrate, an interlayer insulating film formed so as to cover the elements, a pad formed on a surface of the interlayer insulating film and electrically connected with the plurality of elements, a first electrode having a bump shape formed so as to be electrically connected with the pad, and a second electrode formed on a second main surface-side of the semiconductor substrate and formed so as to be electrically connected with the first electrode. Specifically, the first electrode has a protruding portion penetrating through the pad and protruding toward the semiconductor substrate-side, and the second electrode is formed so as to reach the protruding portion of the first electrode part from the second main surface-side of the semiconductor substrate toward the first main surface-side and cover the inside of the second-electrode hole portion which does not reach the pad; thus, the second electrode is electrically connected with the first electrode.

The effects obtained by typical aspects of the present invention will be briefly described below.

More specifically, in a semiconductor device in which a plurality of semiconductor chips are stacked, performance can be enhanced without deteriorating the productivity.

BRIEF DESCRIPTIONS OF THE DRAWINGS

FIG. 49A is an explanatory diagram illustrating another semiconductor device according to the third embodiment of the present embodiment illustrating a structure of a back-surface-electrode hole portion having a rectangular shape in a plane and a joint between the structure and the bump electrode;

FIG. 49B is an explanatory diagram illustrating the another semiconductor device same with FIG. 49A according to the third embodiment of the present embodiment illustrating a structure of the back-surface-electrode hole portion having an oval shape in a plane and a joint between the structure and the bump electrode;

Figure 50A:
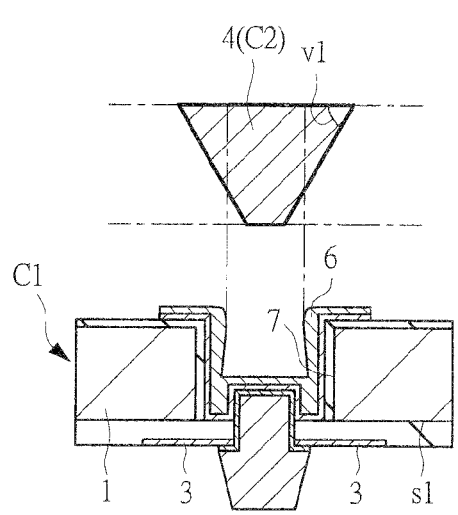
Figure 50B:
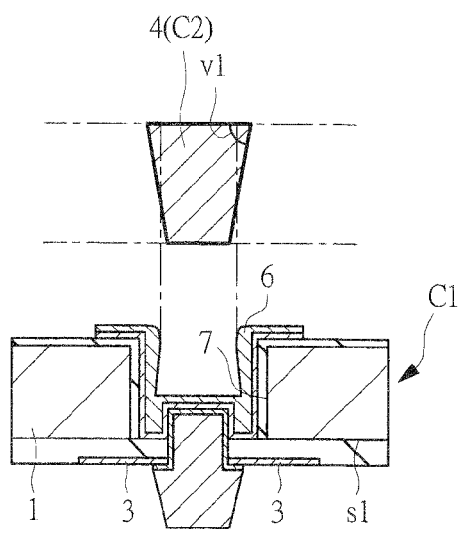
Figure 50B:
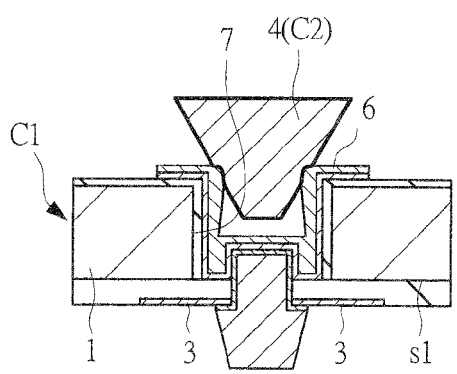
Figure 50B:
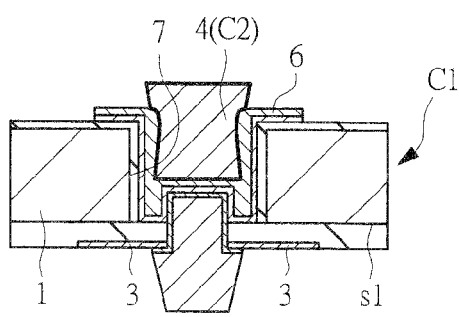

FIG. 50A is an explanatory diagram illustrating the another semiconductor device same with FIGS. 49A and 49B according to the third embodiment of the present invention illustrating a structure of a bump electrode having a sidewall having a low-inclination taper angle and a joint between the structure and a back-surface electrode; and FIG. 50B is an explanatory diagram illustrating the another semiconductor device same with FIG. 50C illustrating a structure of the bump electrode having a sidewall having a steep-inclination taper angle and a joint between the structure and the back-surface electrode.

DESCRIPTIONS OF THE PREFERRED EMBODIMENTS

Note that components having the same function are denoted by the same reference symbols throughout the drawings for describing the embodiment, and the repetitive description thereof will be omitted as much as possible. Hereinafter, embodiments of the present invention will be described in detail with reference to the accompanying drawings.

First Embodiment

Figure 1:
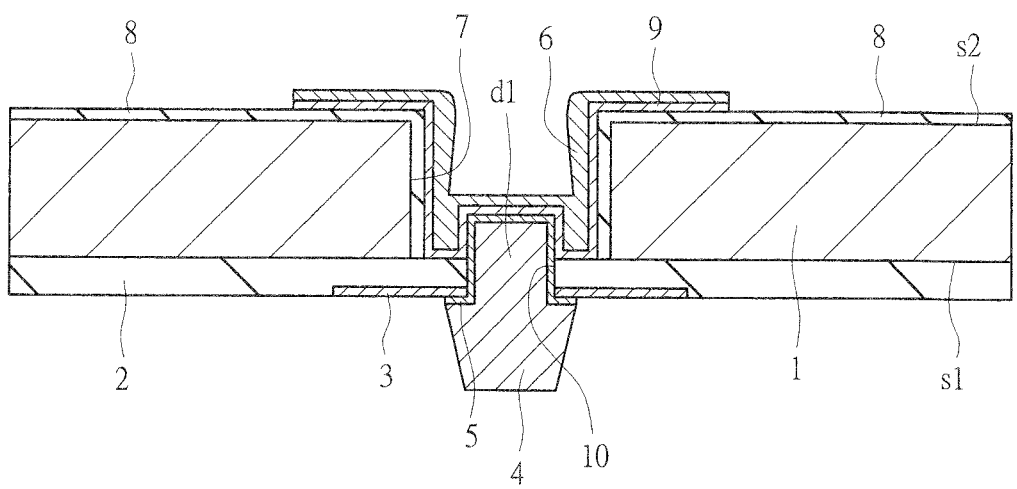
FIG. 1 is a cross-sectional view of a main part of a semiconductor device which is a first embodiment of the present invention.
Figure 2:
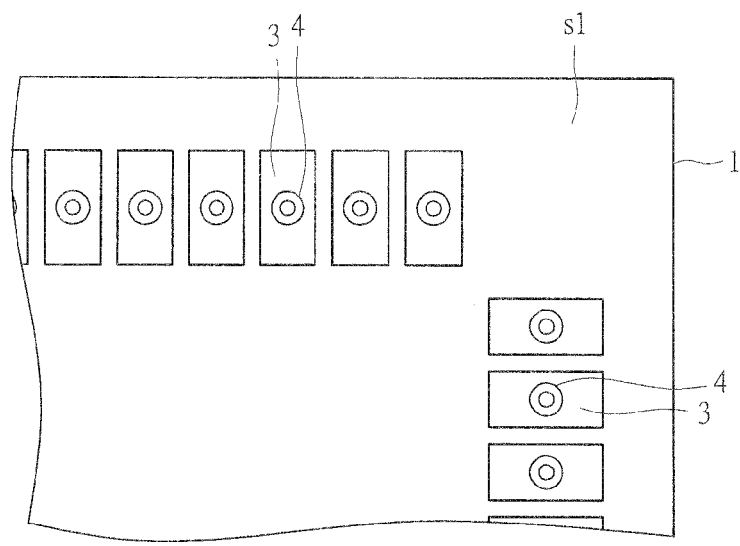
FIG. 2 is a plan view of a main part of the semiconductor device which is the first embodiment of the present invention.
Figure 3:
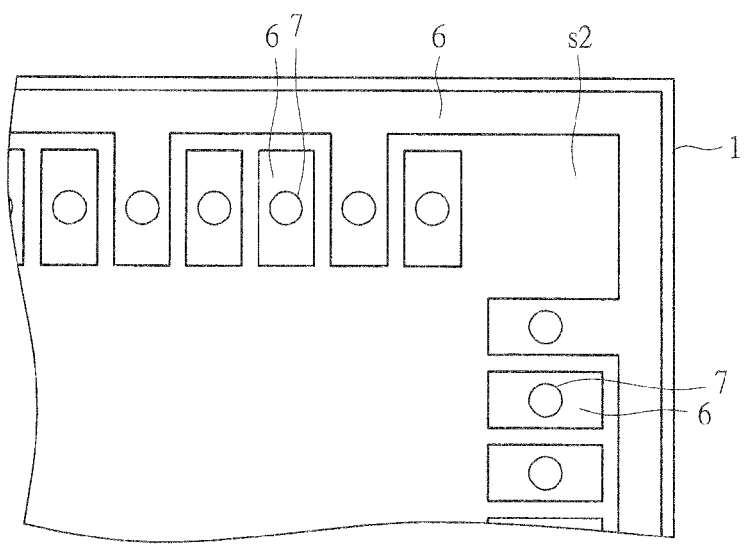
FIG. 3 is a plan view of another main part of the semiconductor device which is the first embodiment of the present invention.

A configuration of a semiconductor device of a first embodiment will be described with reference to FIGS. 1 to 3. FIG. 1 illustrates a cross-sectional view of a main part of a silicon substrate (semiconductor substrate) 1 which the semiconductor device of the first embodiment has. FIG. 2 illustrates a plan view of a main part of a main surface (first main surface) s1-side of the silicon substrate 1. FIG. 3 illustrates a plan view of a main part of a back surface (second main surface) s2-side of the silicon substrate 1. The main surface s1 and the back surface s2 of the silicon substrate 1 are positioned on the sides opposite to each other in a thickness direction of the silicon substrate 1.

A plurality of semiconductor elements (elements) such as field effect transistors (FETs), capacitors, and non-volatile memory cells are formed (not illustrated) on the main surface s1 of the silicon substrate 1. Further, an interlayer insulating film 2 is formed on the main surface s1 of the silicon substrate 1 so as to cover the above-described plurality of elements. The interlayer insulating film is an insulating film mainly formed of silicon oxide. Pads 3 (bonding pads) are formed on the surface of the interlayer insulating film 2. The pads 3 are electrically connected with the plurality of elements on the main surface s1 of the silicon substrate 1 via multilayer wiring and plugs (not illustrated) in the interlayer insulating film 2.

A bump electrode (first electrode) 4 is formed on the pad 3 so as to be electrically connected with the pad. The bump electrode 4 has a so-called bump shape that protrudes to have a predetermined three-dimensional shape in the main surface s1-side of the silicon substrate 1. The bump electrode 4 is a conductor formed of, for example, a single-layer structure of gold (Au), copper (Cu), aluminum (Al), nickel (Ni), or the like or a multi-layer structure of any of these materials.

In the semiconductor device of the first embodiment, the bump electrode 4 has a configuration as described below. That is, the bump electrode 4 of the first embodiment has a protruding portion d1 which penetrates through the pad 3 and protrudes toward the silicon substrate 1-side. As an example, FIG. 1 illustrates the structure in which the protruding portion d1 of the bump electrode 4 is formed so as to also penetrate through the interlayer insulating film 2 and, when viewed in cross-section, reaches the inside of the silicon substrate 1. Moreover, a bump-electrode seed layer (first-electrode seed layer) 5 is formed on a bottom portion of the bump electrode 4 and the protruding portion d1 thereof. The bump-electrode seed layer 5 is a component that is necessary in terms of manufacturing process, and this will be explained in detail when a manufacturing method of the first embodiment is described later.

A back-surface electrode (second electrode) 6 is formed on the back surface s2 of the silicon substrate 1. The back-surface electrode 6 is formed so as to be electrically connected with the bump electrode 4 in a configuration below. A back-surface-electrode hole portion (second-electrode hole portion) 7 is formed so as to reach at least the depth of the protruding portion d1 of the bump electrode 4 from the back-surface s2-side of the silicon substrate 1 toward the main surface s1-side and not to reach the pad 3. The back-surface electrode 6 is formed so as to cover the inside of the back-surface-electrode hole portion 7. Thus, the back-surface electrode 6 and the protruding portion d1 of the bump electrode 4 contact with each other in the back-surface-electrode hole portion 7, and the state in which both of them are electrically connected with each other is achieved. As an example, FIG. 1 illustrates the structure in which the back-surface-electrode hole portion 7 penetrates through the silicon substrate 1 from the second main surface s2 to the first main surface s1 and reaches the interlayer insulating film 2. Also, as an example, the structure in which, when viewed in a plan view, a diameter of the back-surface-electrode hole portion 7 is larger than a diameter of the protruding portion d1 of the bump electrode 4 is illustrated. Therefore, components are disposed so that the protruding portion d1 of the bump electrode 4 is contained inside the back-surface-electrode hole portion 7 when viewed in a plan view.

Moreover, an insulating film 8 is formed at a boundary portion between the back-surface electrode 6 and the silicon substrate 1, so that the back-surface electrode 6 and the silicon substrate 1 are electrically insulated from each other. Moreover, a back-surface-electrode seed layer 9 is formed in a layer below the back-surface electrode 6. The back-surface-electrode seed layer 9 is a component necessary in terms of manufacturing process, and this will be explained in detail when the manufacturing method of the first embodiment is described later.

Note that the back-surface electrode 6 is formed not only the inside of the back-surface-electrode hole portion 7, but also on the second main surface s2 of the silicon substrate 1, which is outside of the hole portion. A metal wire can be connected to this part by wire bonding. As illustrated in FIG. 3, the back-surface electrodes 6 disposed at different locations may be mutually connected on the second main surface s2 of the silicon substrate 1 so as to form wiring.

The structure of the through-electrode which the semiconductor device of the first embodiment has been described above. The effects of the configurations will be described in detail in the following description of a manufacturing process or later in the description of a method of connection with another substrate.

Next, the method of manufacturing the semiconductor device of the first embodiment having the above-described configuration will be described with reference to FIG. 4 to FIG. 19. The drawings are cross-sectional views of a main part of the silicon substrate 1 of the part corresponding to above-described FIG. 1 in the manufacturing process.

In the process, first, the plurality of semiconductor elements such as field effect transistors, capacitors, and non-volatile memory cells are formed (not illustrated) on the main surface s1 of the silicon substrate 1.

Figure 4:
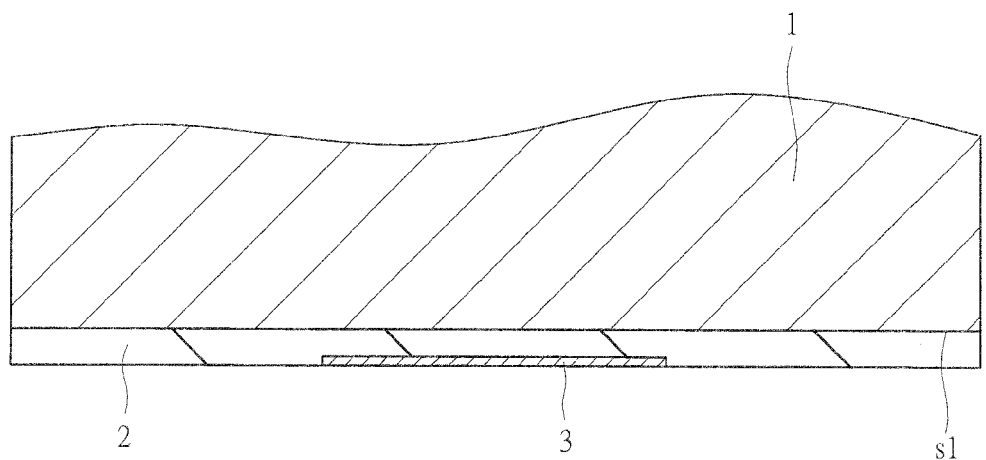
FIG. 4 is a cross-sectional view of a main part of the semiconductor device which is the first embodiment of the present invention in a manufacturing step.

Then, as illustrated in FIG. 4, the interlayer insulating film 2 is formed on the main surface s1 of the silicon substrate 1 so as to cover the plurality of semiconductor elements. The multilayer wiring is formed (not illustrated) in the interlayer insulating film 2 so as to be electrically connected with the semiconductor elements. Subsequently, the pads 3 are formed on the surface of the interlayer insulating film 2. The pads 3 are electrically connected with the multilayer wiring, which is in the interlayer insulating film 2, and are electrically connected with the plurality of semiconductor elements via the multilayer wiring.

Figure 5:
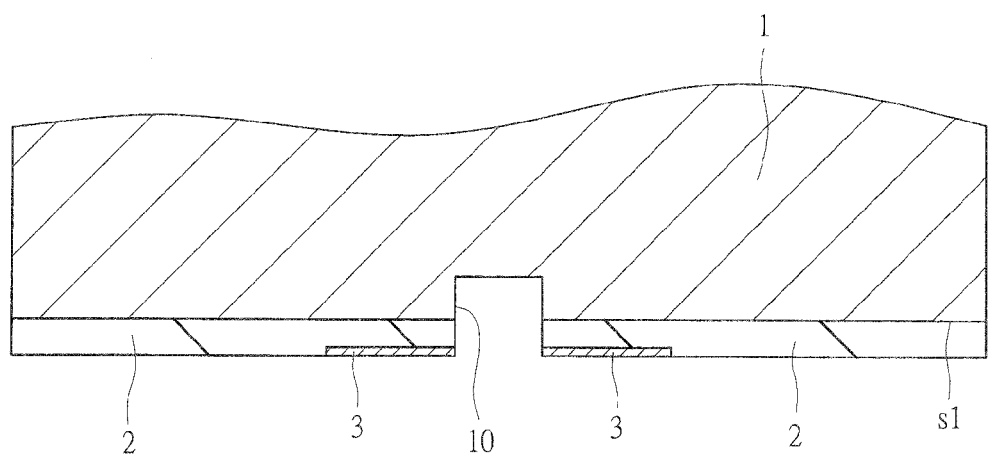
FIG. 5 is a cross-sectional view of a main part of the semiconductor device in a manufacturing step continued from FIG. 4.

Next, as illustrated in FIG. 5, a bump-electrode hole portion (first-electrode hole portion) 10 which penetrates through the pad 3 from the surface-side of the interlayer insulating film 2 and has a depth toward the silicon substrate 1 is formed. To form the bump-electrode hole portion 10, first, a photoresist film (not illustrated) which is patterned by a photolithography method is formed so as to expose part of the pad 3 on the surface of the interlayer insulating film 2. Then, the bump-electrode hole portion 10 is formed by carrying out anisotropic etching by an ICP-RIE (inductively coupled plasma-reactive ion etching) method by using the photoresist film as an etching barrier. Then, the remaining resist mask is removed by, for example, an organic solvent or oxygen ashing. Herein, particularly, the bump-electrode hole portion 10 which penetrates through the pad 3 and the interlayer insulating film 2 from the surface of the interlayer insulating film 2 and has a depth that reaches the silicon substrate 1 is formed.

Figure 6:
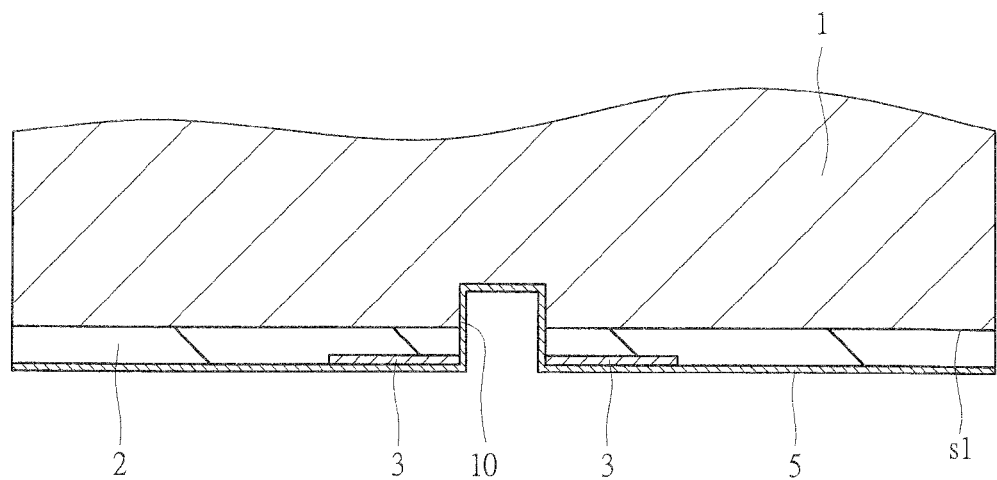
FIG. 6 is a cross-sectional view of a main part of the semiconductor device in a manufacturing step continued from FIG. 5.

Next, as illustrated in FIG. 6, the bump-electrode seed layer 5 is formed on the entire surface of the interlayer insulating film 2 including the inner surface of the bump-electrode hole portion 10. As the seed layer to be formed, for example, a titanium (Ti) film or a titanium tungsten (TiW) film is used. Such bump-electrode seed layer 5 is formed, for example, by a sputtering method, a CVD (chemical vapor deposition) method, or a vapor deposition method.

Figure 7:
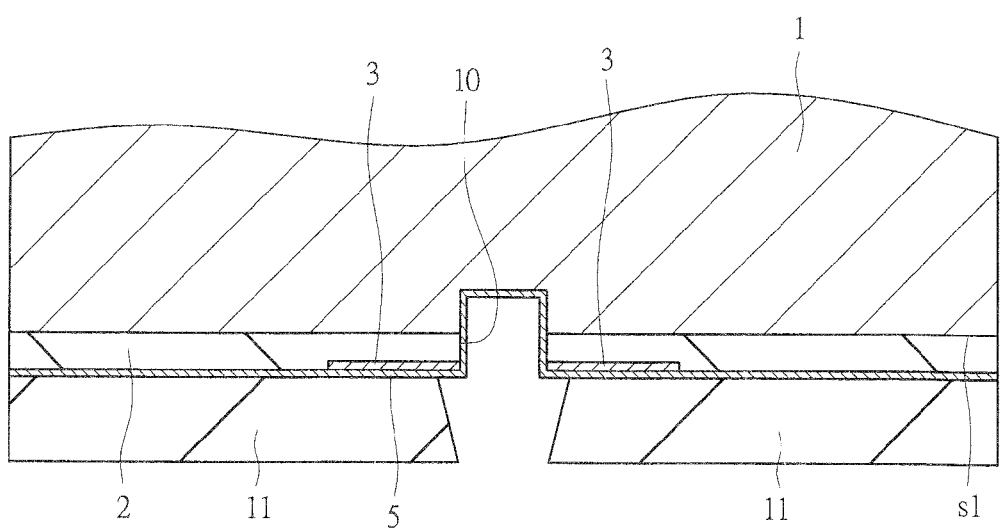
FIG. 7 is a cross-sectional view of a main part of the semiconductor device in a manufacturing step continued from FIG. 6.

Next, as illustrated in FIG. 7, a photoresist film 11 is formed on the entire surface of the main surface s1-side of the silicon substrate 1. The photoresist film 11 is formed by application using a spinner or spray. The formed photoresist film 11 is applied so as to have a film thickness of about 10 to 30 μm. This thickness corresponds to the height of the bump electrode 4 (see above-described FIG. 1), which will be formed later.

Then, the photoresist film 11 is patterned to have a desired shape by a series of photolithography steps, i.e., exposure and development. Particularly, as is described later in detail, the shape of the hole patterned on the photoresist film 11 serves as the outer shape of the bump electrode 4, which will be formed later. In FIG. 7, the hole of the photoresist film 11 having such outer shape is illustrated as an example.

Here, a method of forming the bump electrode 4 will be illustrated as an example so that the bump electrode has the tapered shape as illustrated in above-described FIG. 1 in which the closer the interval between the mutually facing sidewalls to the silicon substrate 1, the wider the interval. Details of this method are described in above-described Patent Document 3. Usually, after the photoresist film 11 or the like is applied, the film is subjected to a heating treatment called pre-baking (or soft baking) before subjected to the exposure step, thereby solidifying the photoresist film. In this process, a temperature inclination is imparted to the silicon substrate 1-side (the back surface-side of the photoresist film 11) and the surface side of the photoresist film 11. As a result, an inclination is generated in accordance with the developing-solution resistance of the photoresist film 11 when viewed in the film-thickness direction. Thus, the hole having the above-described tapered shape can be formed in the photoresist film 11. Note that examples of shapes in a plan view of the formed hole include a circular shape and a polygonal shape. Differences in effects caused by the shapes will be explained in detail in a following third embodiment.

Figure 8:
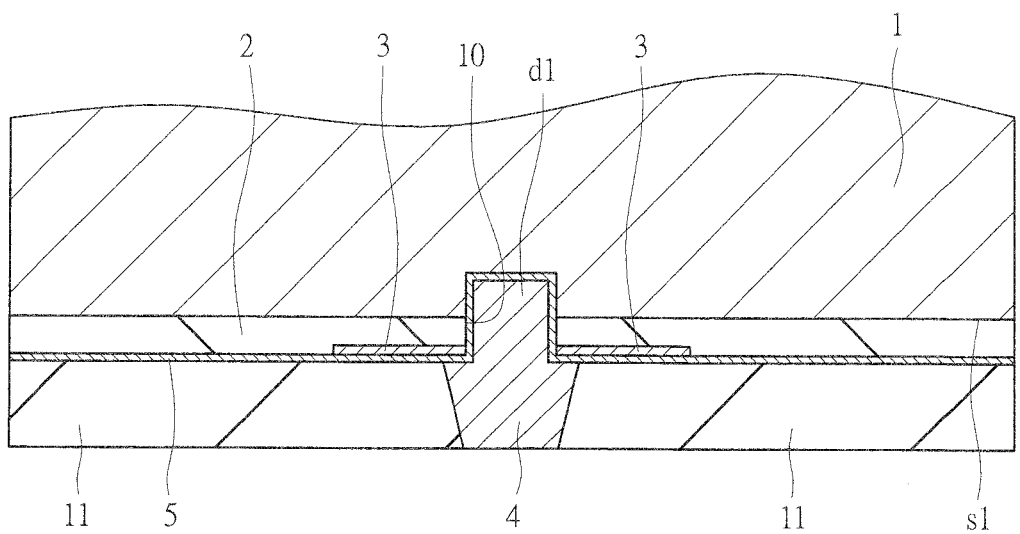
FIG. 8 is a cross-sectional view of a main part of the semiconductor device in a manufacturing step continued from FIG. 7.

Next, as illustrated in FIG. 8, a metal is embedded in the hole of the photoresist film 11 by the electrolytic plating method (also referred to as electroplating) so as to form the bump electrode 4. The embedded metal is, for example, a single-layer structure of Au, Cu, Al, Ni, or the like or a multi-layer structure of any of these metals. However, as is described in detail later, since the bump electrode 4 connects chips by utilizing its plastic deformation, the uppermost surface of the bump electrode 4 is desirably Au which readily undergoes plastic deformation. Then, the photoresist film 11 is removed, for example, by an organic solvent or oxygen ashing.

The bump electrode 4 having the protruding portion d1 as described with reference to above-described FIG. 1 which the semiconductor device of the first embodiment has can be formed in the above-described manner.

Figure 9:
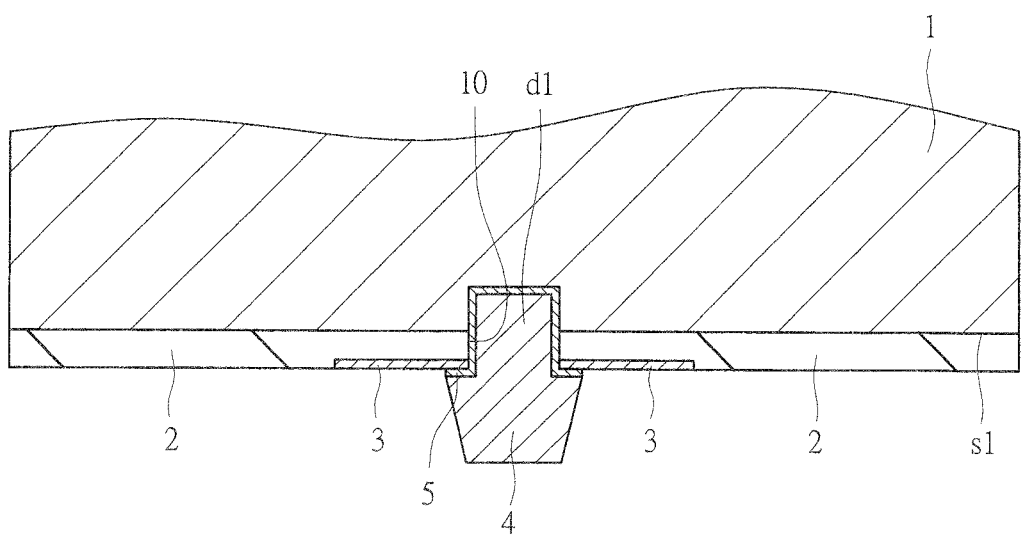
FIG. 9 is a cross-sectional view of a main part of the semiconductor device in a manufacturing step continued from FIG. 8.

Next, as illustrated in FIG. 9, part of the bump-electrode seed layer 5 that is not covered with the bump electrode 4 is removed by etching. Herein, the etching is more preferably carried out with using the bump electrode 4 as an etching mask, without forming another etching mask. Thus, the number of steps can be reduced. A conceivable etching method in this process is, for example, dry etching using ICP-RIE or wet etching using an etching solution.

Figure 10:
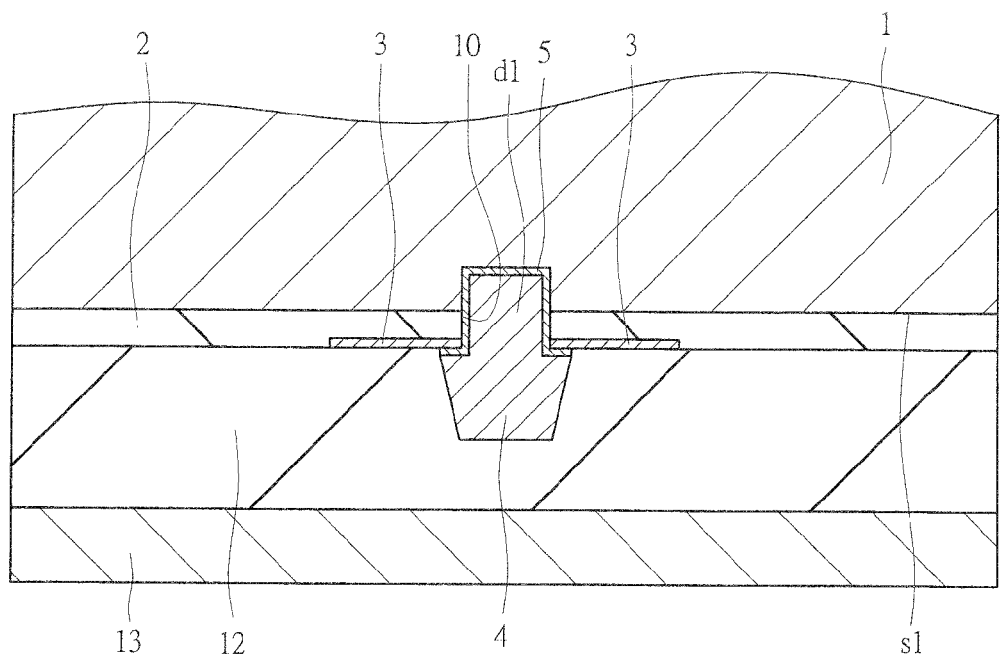
FIG. 10 is a cross-sectional view of a main part of the semiconductor device in a manufacturing step continued from FIG. 9.

Next, as illustrated in FIG. 10, an adhesion layer 12 is applied onto the surface of the interlayer insulating film 2, and a support wafer 13 such as quartz glass or a silicon wafer is pasted on the adhesion layer 12. When the support wafer 13 is pasted on the adhesion layer 12, strength deterioration, warpage, etc. which may be generated when the thickness of the silicon substrate 1 is reduced in a later step can be suppressed. Further, the adhesion layer 12 plays a role of protecting the plurality of elements, the multi-layer wiring, the bonding pads 3, the bump electrodes 4, etc. formed on the main surface s1 of the silicon substrate 1. For example, an epoxy-based adhesive agent or a photoresist film is conceivable as such an adhesion layer 12, and the material of the adhesion layer 12 has to enable peel-off of the support wafer 13 after formation of the through-electrode.

Figure 11:
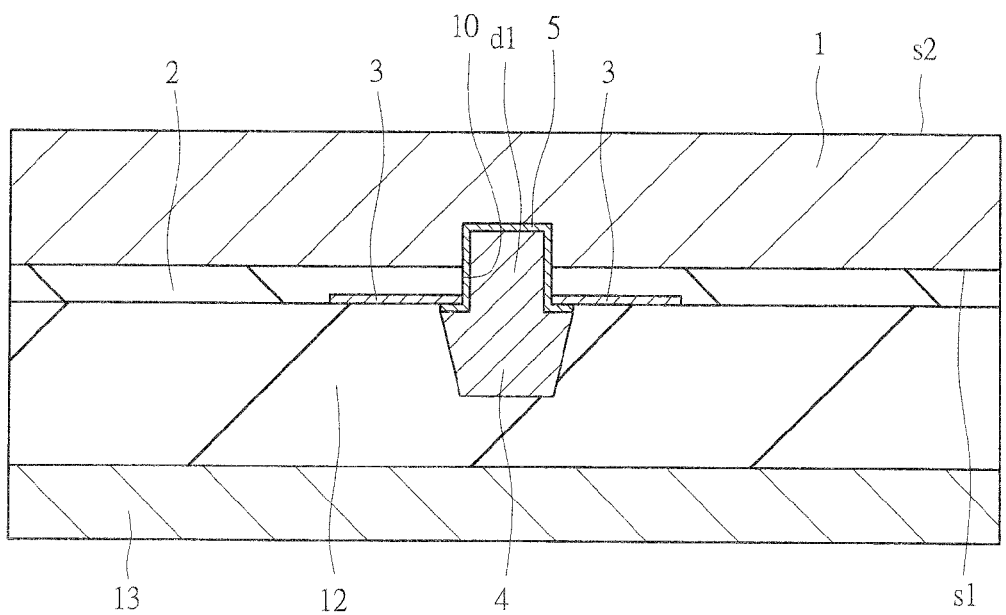
FIG. 11 is a cross-sectional view of a main part of the semiconductor device in a manufacturing step continued from FIG. 10.

Next, as illustrated in FIG. 11, the silicon substrate 1 is subjected to a back grind treatment from the back surface s2-side, thereby reducing the thickness of the silicon substrate 1. Examples of the method of the back grind treatment include grinding, polishing, etc. Note that the flatness of the back surface s2 of the silicon substrate 1 after grinding affects the processing accuracy of the through-electrodes. Therefore, dry polishing, etching, or CMP (chemical mechanical polishing) is desired to be carried out after the back grind treatment.

Figure 12:
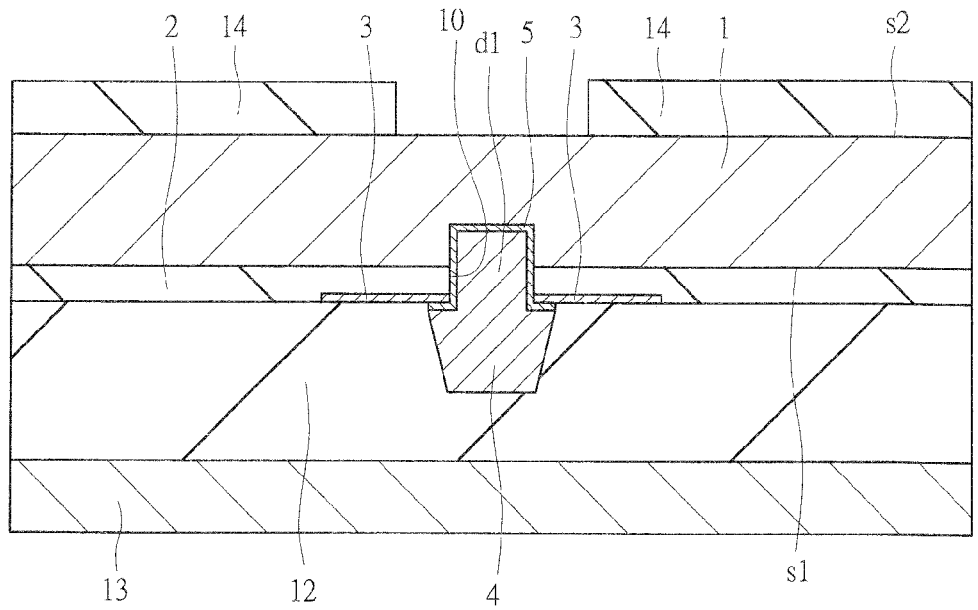
FIG. 12 is a cross-sectional view of a main part of the semiconductor device in a manufacturing step continued from FIG. 11.

Next, as illustrated in FIG. 12, a photoresist film 14 is applied onto the back surface s2 of the silicon substrate 1 and subjected to patterning by a series of photolithography. Herein, an opening portion is formed in the photoresist film 14 so that part of the silicon substrate 1 on which the back-surface-electrode hole portion 7 (see above-described FIG. 1) will be processed later is exposed. More specifically, the opening-portion formation position of the photoresist film 14 is determined at the position of the pad 3 and the bump electrode 4 among the components formed in the stage of the present step. Examples of the method of adjusting the position include a method which checks the pad 3 by transmission through the silicon of the substrate from the back surface s2 of the silicon substrate 1 by using, for example, an infrared microscope and a method which carries out checking by disposing optical systems on the main surface s1 and the back surface s2 of the silicon substrate 1.

Figure 13:
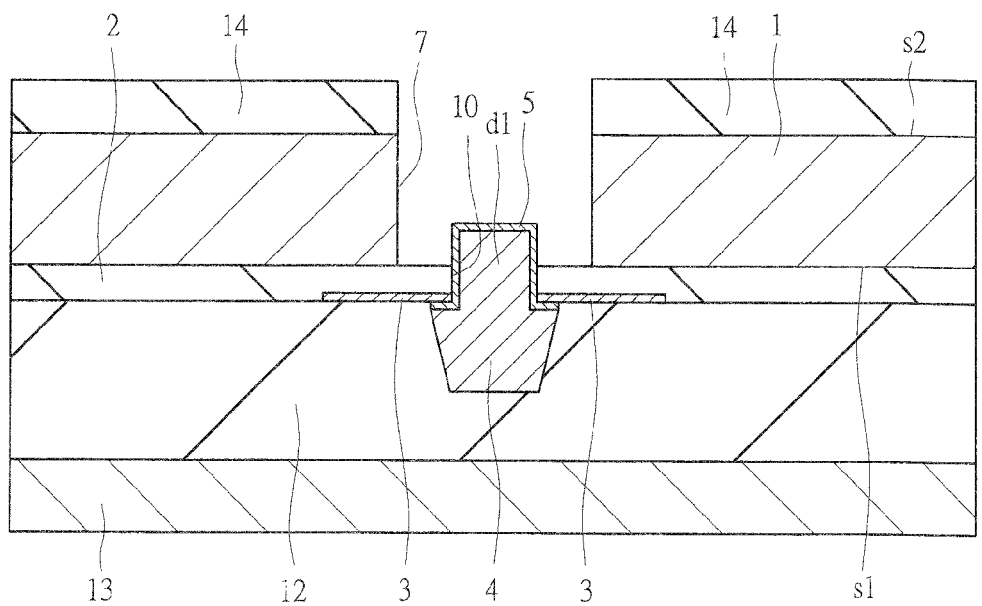
FIG. 13 is a cross-sectional view of a main part of the semiconductor device in a manufacturing step continued from FIG. 12.

Next, as illustrated in FIG. 13, anisotropic etching is carried out by ICP-RIE, thereby forming the back-surface-electrode hole portion 7 in the back surface s2 of the silicon substrate 1. Note that, for example, $SF_6$ or $C_4F_8$ is used as a process gas. Usually, upon dry etching of the silicon substrate 1, etching is carried out with using a silicon oxide film or the like as an etching mask. Therefore, the etching is stopped at the interlayer insulating film 2 which is formed of a silicon oxide film as a primary component. Therefore, the depth of the back-surface-electrode hole portion 7 is determined by the thickness of the silicon substrate 1. In this manner, the back-surface-electrode hole portion 7 as explained in above-described FIG. 1 included in the semiconductor device of the first embodiment can be formed.

Figure 14:
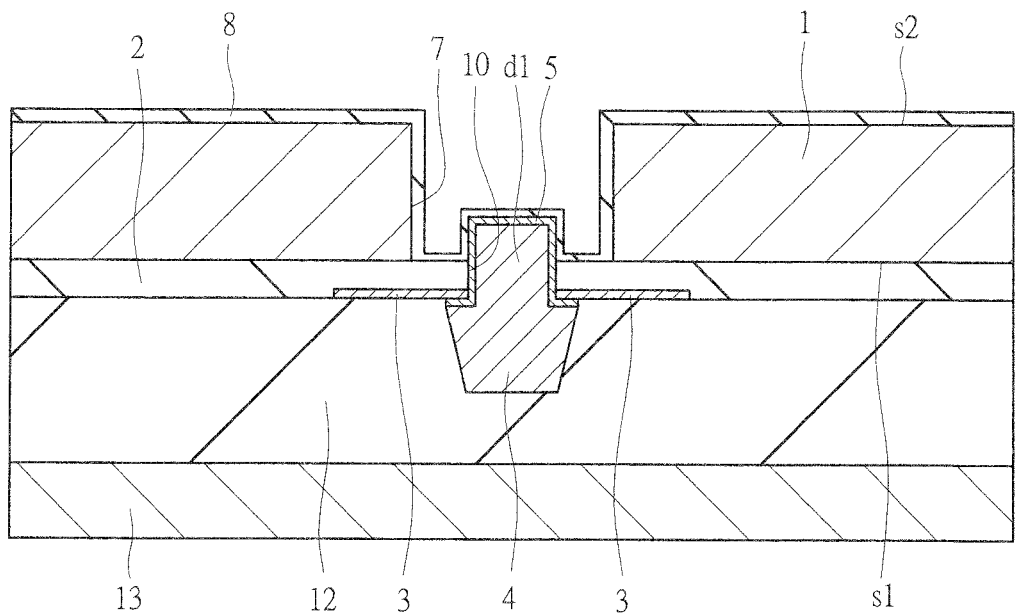
FIG. 14 is a cross-sectional view of a main part of the semiconductor device in a manufacturing step continued from FIG. 13.

Next, as illustrated in FIG. 14, the insulating film 8 is formed on the entire surface of the back surface s2 of the silicon substrate 1 including the inner surface of the back-surface-electrode hole portion 7, for example, by a CVD method. An insulating film mainly formed of, for example, silicon oxide, silicon nitride, or a polyimide resin is formed as the insulating film 8. Herein, a process gas does not readily enter the inside of the back-surface-electrode hole portion 7, and the insulating film 8 deposited on the inside of the back-surface-electrode hole portion 7 becomes thinner than the insulating film 8 deposited outside of the back-surface-electrode hole portion 7. Note that, upon the film formation, in the CVD method, film formation is generally carried out at a temperature of about 300° C. to 500° C. Regarding this, in the manufacturing method of the first embodiment, the insulating film 8 may be formed at a lower temperature so that the adhesion layer 12 used for pasting the support wafer 13 is not deteriorated and peeled off.

Figure 15:
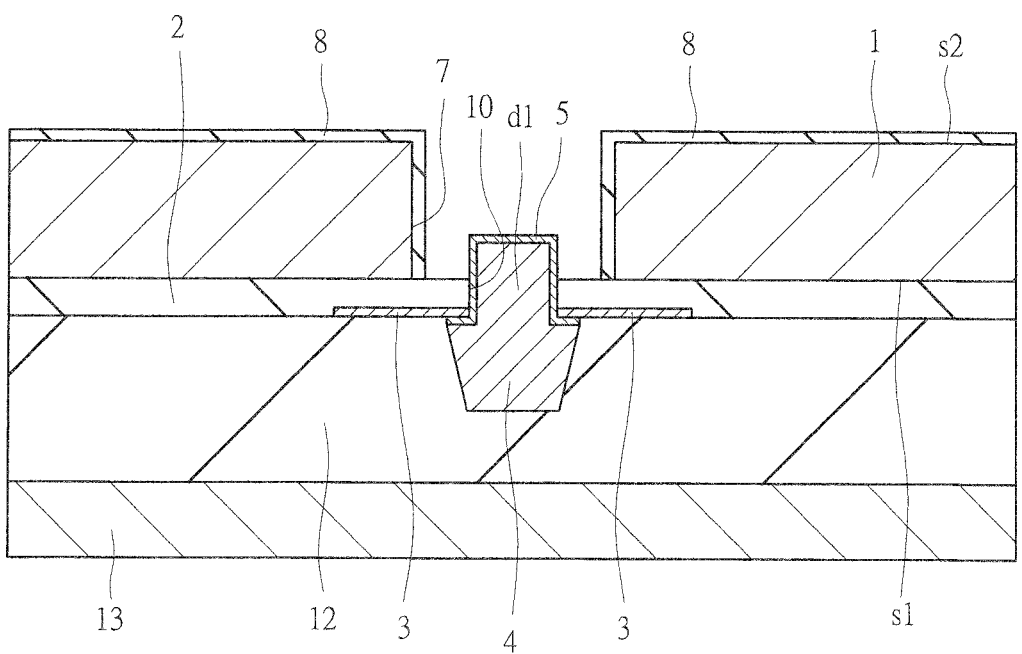
FIG. 15 is a cross-sectional view of a main part of the semiconductor device in a manufacturing step continued from FIG. 14.

Next, as illustrated in FIG. 15, in the insulating films formed on the inside of the back-surface-electrode hole portion 7, the insulating film 8 that is on the bottom portion in the hole is removed. Herein, the insulating film 8 is removed until the protruding portion d1 of the bump electrode 4 is exposed. However, the removal is adjusted so that the silicon substrate 1 is not exposed by the etching of the present step, in order to prevent a connection between the back-surface electrode 6 (see above-described FIG. 1), which will be formed later, and the silicon substrate 1. A dry etching that exhibits anisotropy in the direction perpendicular to the back surface s2 of the silicon substrate 1 is carried out. At this point, as described above, the insulating film 8 on the inside of the back-surface-electrode hole portion 7 is thin compared with the insulating film 8 that is outside of the hole portion 7. Therefore, when the anisotropic etching is carried out in the above-described manner, the insulating film 8 that is covering the sidewalls and also the thick insulating film 8 that is outside of the hole are remained without being completely removed even when the insulating film 8 that is on the bottom portion of the back-surface-electrode hole portion 7 is removed to a degree at which the protruding portion d1 of the bump electrode 4 is exposed. Thus, in the periphery of the back-surface-electrode hole portion 7, the insulating film 8 can be processed so that the protruding portion d1 of the bump electrode 4 is exposed and the silicon substrate 1 is in the state covered with the insulating film 8.

Figure 16:
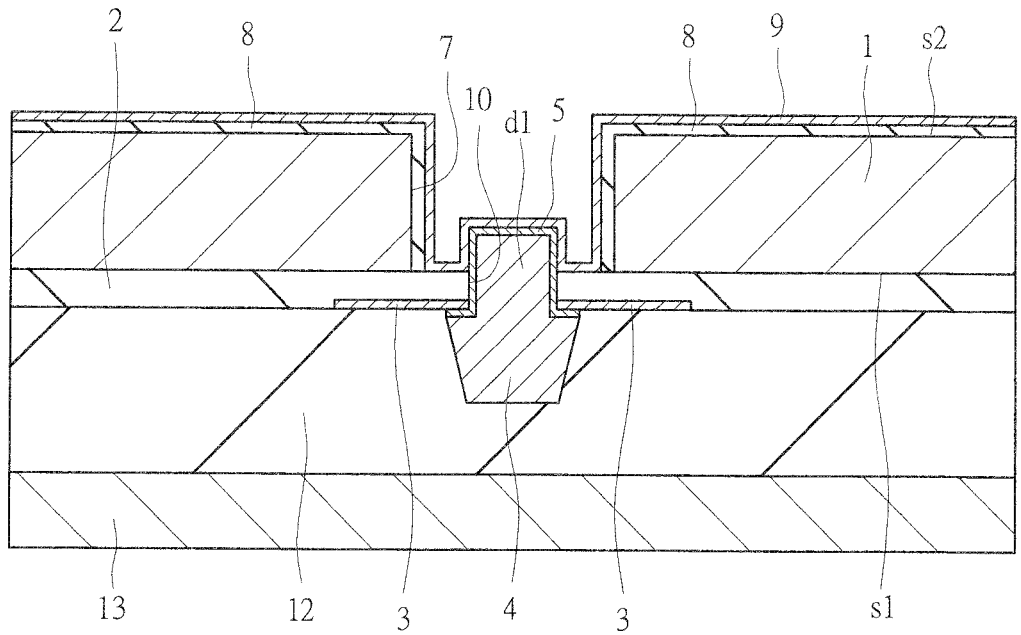
FIG. 16 is a cross-sectional view of a main part of the semiconductor device in a manufacturing step continued from FIG. 15.

Next, as illustrated in FIG. 16, the back-surface-electrode seed layer 9 is formed on the back surface s2 of the silicon substrate 1 including the inner surface of the back-surface-electrode hole portion 7, for example, by a sputtering method. As the formed back-surface-electrode seed layer 9, for example, stacked films of a Ti film of about 0.02 to 0.3 μm and an Au film of about 0.3 to 2 μm are formed. The Ti film is formed in order to improve the adhesiveness between the insulating film 8 and the Au film, and the Au film is formed as a seed layer for forming the back-surface electrode later by a plating method. Other than this, for example, stacked films of a chromium (Cr) film and an Au film may be formed as the back-surface-electrode seed layer 9.

Figure 17:
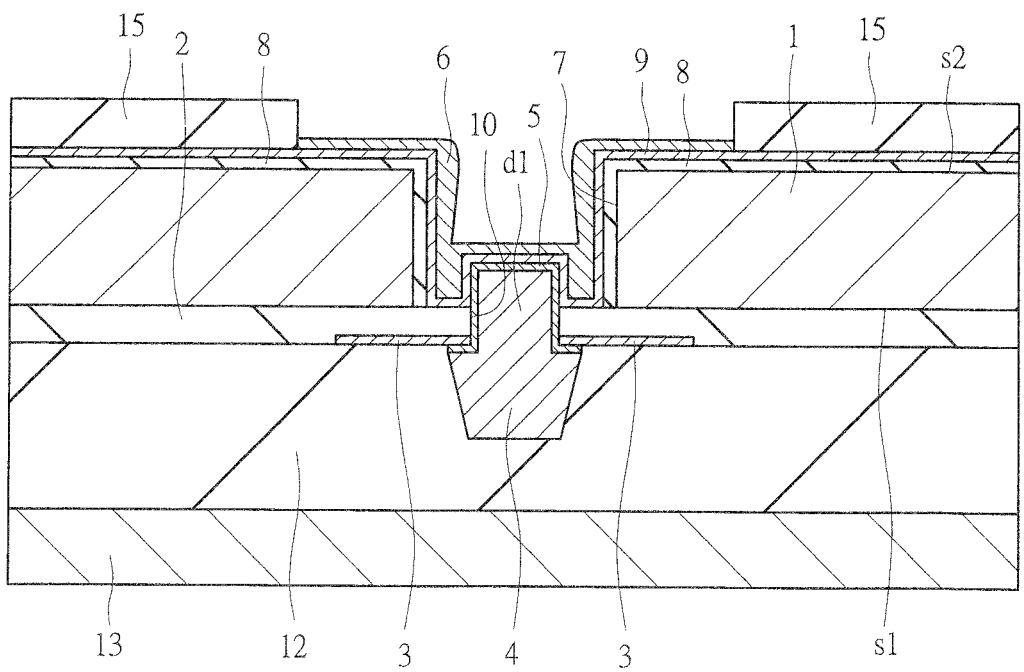
FIG. 17 is a cross-sectional view of a main part of the semiconductor device in a manufacturing step continued from FIG. 16.

Next, as illustrated in FIG. 17, a photoresist film 15 is formed on the back surface s2-side of the silicon substrate 1 and subjected to patterning by a photolithography method. In this process, an opening is formed in the photoresist film 15 so as to expose the back-surface-electrode seed layer 9 at the location at which the back-surface electrode 6 described with reference to above-described FIG. 1 is to be formed.

Subsequently, a metal film is formed by carrying out an electrolytic plating method with using the back-surface-electrode seed layer 9 at the part exposed from the photoresist film 15. As a result, the metal film is deposited so as to cover the back-surface-electrode seed layer 9, and the back-surface electrode 6 can be formed. The metal film has a film thickness that does not completely fill the back-surface-electrode hole portion 7. The metal film has, for example, a single-layer structure of Au, Cu, Al, Ni, or the like or a multi-layer structure of any of these metals. However, as is described later in detail, since the back-surface electrode 6 connects chips by utilizing its plastic deformation, the uppermost surface of the back-surface electrode 6 is desired to be Au which readily undergoes plastic deformation. Then, the photoresist film 15 is removed, for example, by an organic solvent or oxygen ashing.

Figure 18:
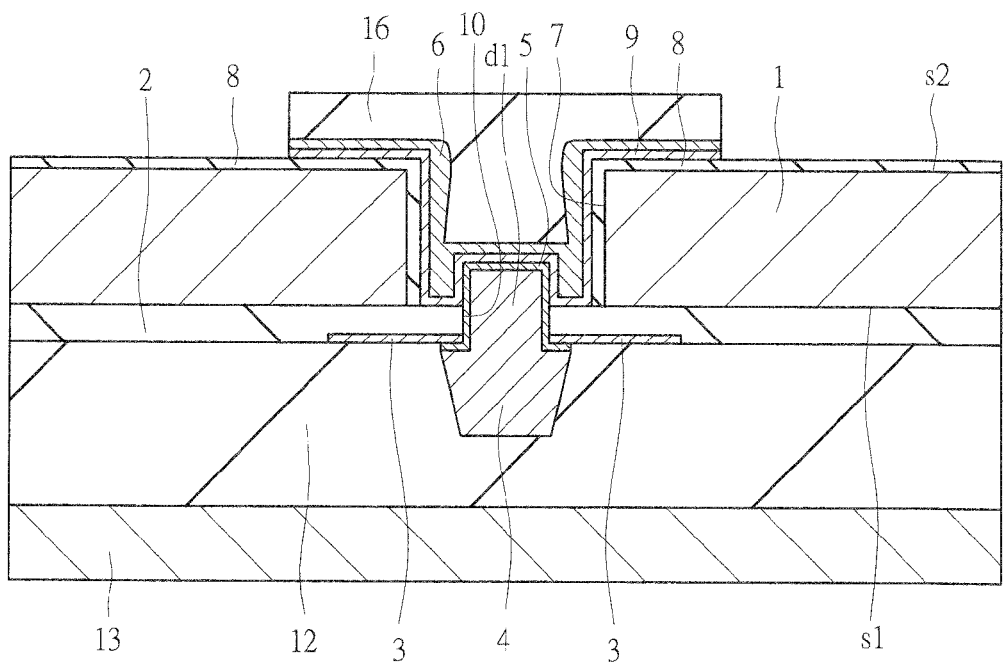
FIG. 18 is a cross-sectional view of a main part of the semiconductor device in a manufacturing step continued from FIG. 17.

Next, as illustrated in FIG. 18, a photoresist film 16 which covers the back-surface-electrode hole portion 7 and the back-surface electrode 6 is formed by a photolithography step. Then, the back-surface-electrode seed layer 9 is subjected to etching with using the photoresist film 16 as an etching mask. As a result, part of the back-surface-electrode seed layer 9 not covered with the photoresist film 16 and the back-surface electrode 6 is removed. For example, a mixed solution of iodide and ammonium iodide is used as the etching solution of the Au film, and fluorine is used as the etching solution of the Ti film.

Figure 19:
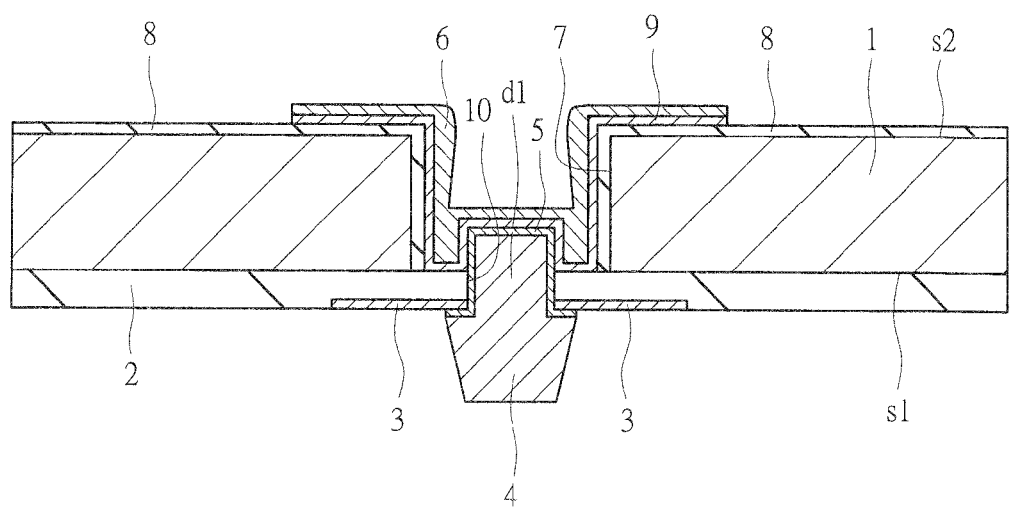
FIG. 19 is a cross-sectional view of a main part of the semiconductor device in a manufacturing step continued from FIG. 18.

Then, the photoresist film 16 is removed, for example, by an organic solvent or oxygen ashing. Furthermore, the adhesion layer 12 is removed from the silicon substrate 1, thereby peeling off the support wafer 13. For example, if the adhesion layer 12 is thermoplastic, the support wafer 13 is peeled off by heating. Alternatively, if the support wafer 13 is adhered by using, for example, a photoresist film, the support wafer 13 is peeled off by an organic solvent or the like. The through-electrode included in the semiconductor device of the first embodiment and having the structure as illustrated in FIG. 19 can be formed by the above-described steps.

In a subsequent step, the wafer-like silicon substrate 1 is singulated into chips by blade dicing. Herein, when the chips are singulated after the support wafer 13 is peeled off in the above-described manner, although handling becomes difficult, the support wafer 13 can be reused.

When the semiconductor device having the through-electrode having the structure according to the first embodiment described above is employed, the following effects can be exerted.

In the through-electrode structure according to the first embodiment, the bump electrode 4 has the protruding portion d1, and the protruding portion has the shape that is inserted in the silicon substrate 1-side when viewed from the pad 3. This has the effect that facilitates processing of the back-surface-electrode hole portion 7, which is formed from the surface (back surface s2) of the silicon substrate 1 on the opposite side. This is for the reason that, while the hole portion usually has to be dug down to the back surface of the pad, the necessary dug-down amount can be reduced by the amount corresponding to the protrusion of the protruding portion d1 of the bump electrode 4 in the first embodiment.

Particularly, when the back-surface-electrode hole portion 7 is desired to reach the pad 3, the interlayer insulating film 2, which is at the bottom of the hole and is not readily processed, has to be processed, and etching has to be stopped without damaging the thin pad 3. Compared with this, in the manufacturing method of the first embodiment, the protruding portion d1 of the bump electrode 4 is formed so as to penetrate through the pad 3; therefore, the processing amount of the interlayer insulating film 2 can be correspondingly reduced. Furthermore, since the pad 3 is not required to be processed from the back surface s2-side, damage caused on the pad 3 can be reduced. As a result, the performance can be enhanced in the semiconductor device, in which a plurality of semiconductor chips are stacked, without deteriorating the productivity.

Moreover, in the manufacturing method of the first embodiment, as described above, the electrolytic plating method can be employed as the method of forming the bump electrode 4. The bump electrodes 4 formed by the electrolytic plating method can be disposed at a smaller distance (pitch), for example, compared with stud bumps. In this manner, when the through-electrode having the structure according to the first embodiment is applied, a semiconductor device having a structure suitable for increasing the number of pins can be realized. As a result, the performance can be further enhanced in the semiconductor device, in which a plurality of semiconductor chips are stacked, without deteriorating productivity.

Second Embodiment

In a second embodiment, a structure which exerts different effects by changing the shape of the through-electrode in the semiconductor device of the above-described first embodiment will be described. A semiconductor device of the second embodiment has a similar configuration and similar effects as the semiconductor device of the above-described first embodiment except for the configuration described below.

Figure 20:
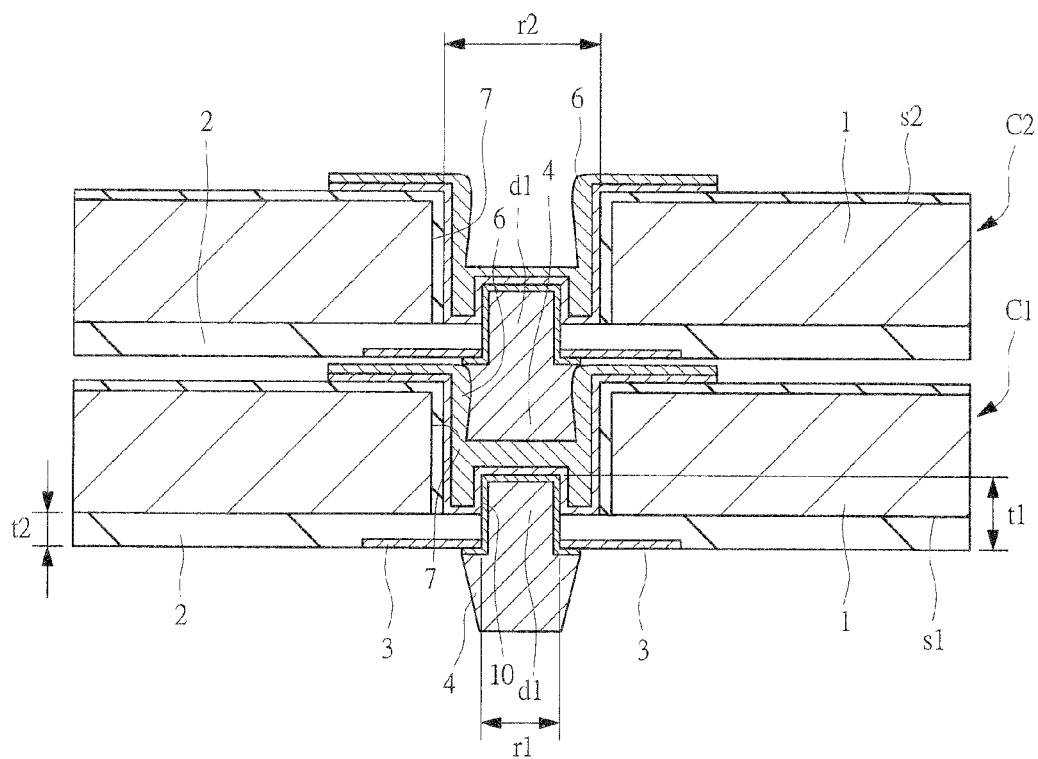
FIG. 20 is a cross-sectional view of a main part of a semiconductor device of a first structure according to a second embodiment of the present invention.

A first structure will be described with reference to FIG. 20. The through-electrode of the semiconductor device of the second embodiment has a structure similar to that of the through-electrode of the semiconductor device of the above-described first embodiment. Specifically, the bump electrode 4 formed in the main surface s1-side of the silicon substrate 1 has the protruding portion d1, and the protruding portion d1 penetrates through the pad 3, also penetrates through the interlayer insulating film 2, and protrudes to the inside of the back-surface-electrode hole portion 7. In other words, this can be expressed to be the structure that satisfies the following conditions. Specifically, when the silicon substrate 1 is viewed in a plan view, a protruding-portion diameter r1 which is the diameter of the protruding portion d1 of the bump electrode 4 is smaller than a hole-portion diameter r2 which is the diameter of the back-surface-electrode hole portion 7. Furthermore, as a length of the protruding portion d1 of the bump electrode 4, a protruding-portion length t1 which is the length of the protruding portion d1 viewed from the surface of the interlayer insulating film 2 is larger than an interlayer-film thickness t2 which is the thickness of the interlayer insulating film 2.

Herein, as an example, the case in which two chips (a first chip C1 and a second chip C2) having the through-electrode structures as described above are electrically connected with each other will be described. The through-electrode structures of the first chip C1 and the second chip C2 are the same. In this case, the back-surface-electrode hole portion 7 of the first chip C1 is caulked with the bump electrode 4 of the second chip C2. In the present specification, "caulking" refers to, for example, fitting the protruding portion in the hole portion so as to bring them to close contact with each other. In this case, the bump electrode 4 of the second chip C2 is fit in the back-surface-electrode hole portion 7 of the first chip C1, and the bump electrode 4 is brought into close contact with the sidewalls of the back-surface-electrode hole portion 7. As a result, the back-surface electrode 6 of the first chip C1 formed on the sidewalls of the back-surface-electrode hole portion 7 is brought into contact with the bump electrode 4 of the second chip C2. In this manner, the first chip C1 and the second chip C2 can be electrically connected with each other.

Furthermore, a following effect is also provided. In the semiconductor device of the second embodiment, in the through-electrode structure thereof, the bottom portion of the back-surface electrode 6 is pushed up by the protruding portion d1 of the bump electrode 4. In other words, the back-surface electrode 6 is formed so as to be shallower than the depth of the back-surface-electrode hole portion 7. Therefore, when the bump electrode 4 of the second chip is fit in the back-surface-electrode hole portion 7 of the first chip C1, the bump electrode 4 is crushed and undergoes plastic deformation in a lateral direction; thus, a stronger caulking connection can be realized. As a result, in the semiconductor device, in which a plurality of semiconductor chips are stacked, the stability can be improved.

Next, a second structure will be described with reference to FIG. 21. In the second structure, the magnitude relation between the protruding-portion diameter r1 of the bump electrode 4 and the hole-portion diameter r2 of the back-surface-electrode hole portion 7 is the same as the above-described first structure. More specifically, the protruding-portion diameter r1 is smaller than the hole-portion diameter r2. Furthermore, in the second structure, the protruding-portion length t1 of the bump electrode 4 is smaller than the interlayer-film thickness t2. Therefore, in the second structure, the protruding portion d1 of the bump electrode 4 is formed so as to protrude within the interlayer insulating film 2 without reaching the silicon substrate 1.

A method of manufacturing the semiconductor device having the through-electrode of the second structure will be described. First, in the same manner with the above-described method of FIG. 4, the plurality of semiconductor elements, the interlayer insulating film 2, and the pads 3 are formed on the main surface s1 of the silicon substrate 1.

Figure 22:
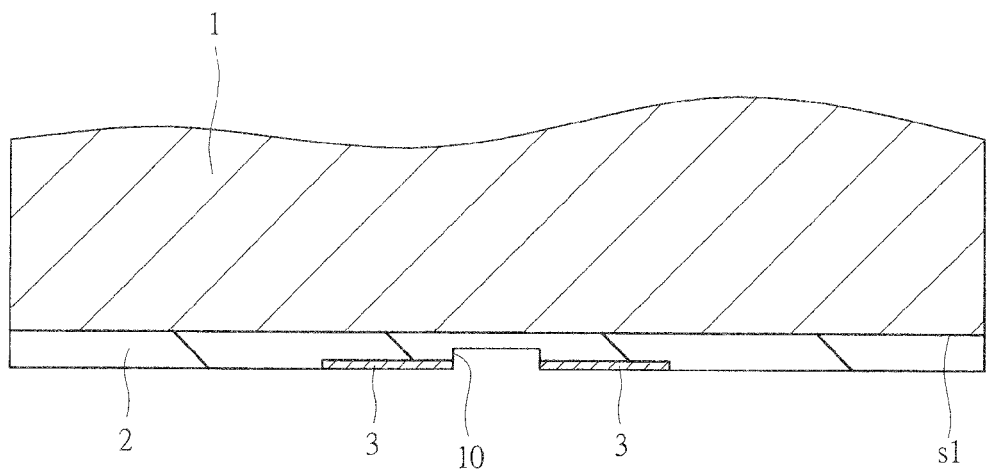
FIG. 22 is a cross-sectional view of a main part of the semiconductor device of the second structure according to the second embodiment of the present invention in a manufacturing step and is a cross-sectional view of the main part in a step subsequent to that of FIG. 4.

Then, as illustrated in FIG. 22, the bump-electrode hole portion 10 is formed in the same manner as the above-described method of FIG. 5. However, in the present step, the bump-electrode hole portion 10 is formed so as not to reach the silicon substrate 1. In other words, the bump-electrode hole portion 10 is formed by carrying out anisotropic etching so that the etching stops in the middle of the interlayer insulating film 2. In the subsequent process, steps similar to those of above-described FIGS. 6 to 12 are carried out.

Figure 23:
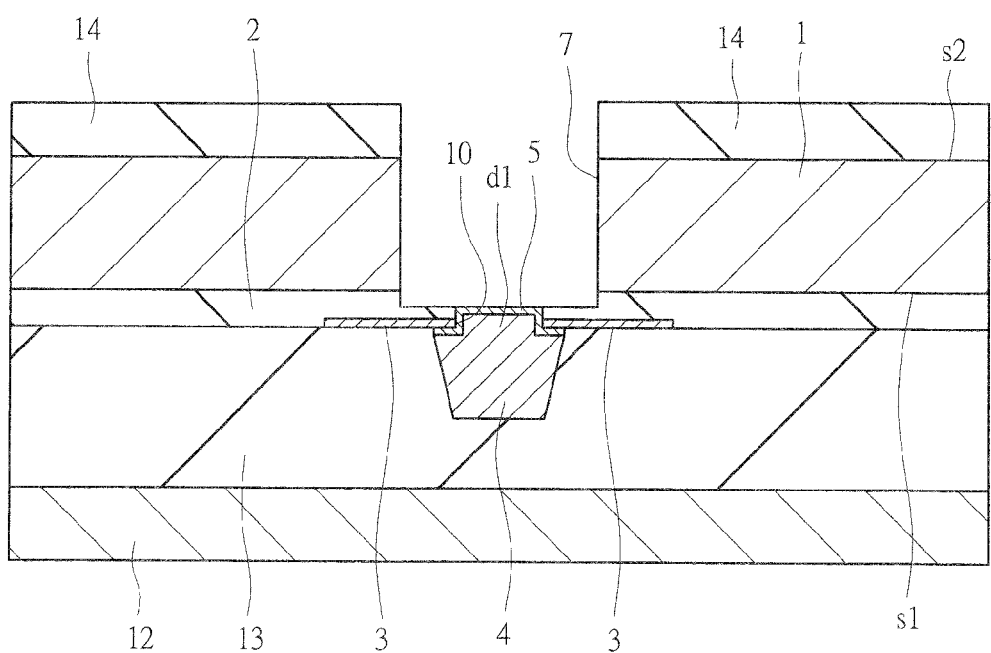
FIG. 23 is a cross-sectional view of the main part of the semiconductor device of the second structure according to the second embodiment of the present invention in a manufacturing step and is a cross-sectional view of the main part in a step subsequent to that of FIG. 12.

Subsequently, as illustrated in FIG. 23, in the same manner as the above-described method of FIG. 13, the back-surface-electrode hole portion 7 is formed from the back surface s2 of the silicon substrate 1. However, in the present step, the back-surface-electrode hole portion 10 is formed so as to penetrate through the silicon substrate 1 and to grind part of the interlayer insulating film 2. In this case, the process gas such as $SF_6$ or $C_4F_8$ used for etching the silicon substrate 1 is changed to $C_3F_8$, Ar, $CHF_4$, or the like for etching the interlayer insulating film 2. In this process, without forming a new etching mask, the interlayer insulating film 2 is subjected to anisotropic etching with using the residue of the photoresist film 14 and the back surface s2 of the silicon substrate 1 as an etching mask. Particularly, the anisotropic etching is carried out until the protruding portion d1 (bump-electrode seed layer 5) of the bump electrode 4 in the interlayer insulating film 2 is exposed.

Figure 21:
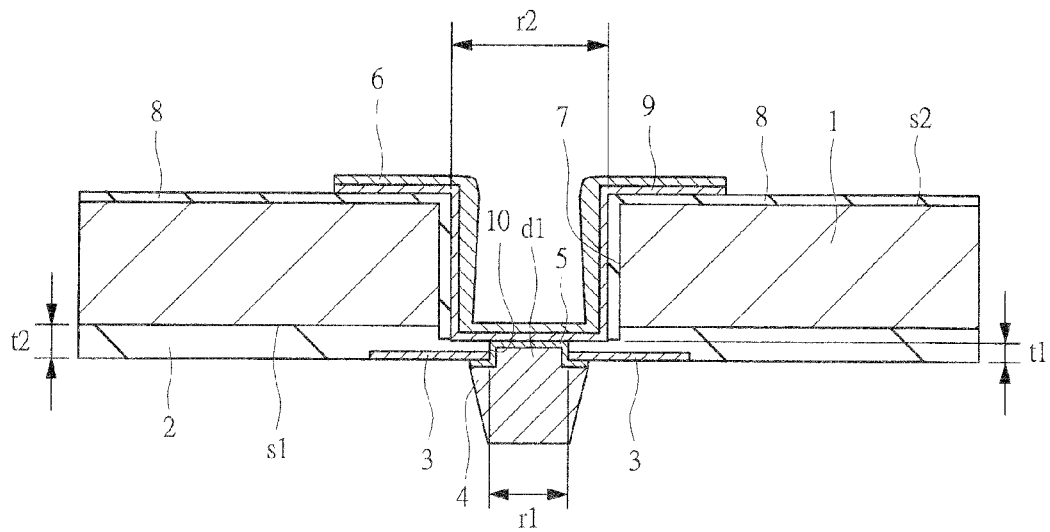
FIG. 21 is a cross-sectional view of a main part of a semiconductor device of a second structure according to the second embodiment of the present invention.

Then, steps similar to those of above-described FIGS. 14 to 19 are carried out, thereby forming the through-electrode having the second structure of the second embodiment illustrated in above-described FIG. 21.

Even in the method of forming the back-surface-electrode hole portion 7 as described above, etching to penetrate through the interlayer insulating film 2 and reach the pad 3 is not necessary to be carried out. This is for the reason that, similarly to the above-described first embodiment, the bump electrode 4 has the protruding portion d1 which penetrates through the pad 3, and the etching is required to be carried out to expose at least the protruding portion d1. By virtue of the method that forms the hole portion from both sides of the silicon substrate 1 in this manner, the following effects can be obtained as same as the above-described first embodiment. Specifically, since the protruding portion d1 of the bump electrode 4 is formed so as to penetrate through the pad 3, the processing amount of the interlayer insulating film 2 can be correspondingly reduced. Furthermore, since the pad 3 is not required to be processed from the back surface s2-side, damage caused on the pad 3 can be reduced. As a result, in the semiconductor device in which a plurality of semiconductor chips are stacked, the performance can be enhanced without deteriorating the productivity.

Furthermore, according to the second structure, the structure in which the protruding portion d1 of the bump electrode 4 does not protrude to the inside of the back-surface-electrode hole portion 7 can be obtained. As a result, the back-surface electrode 6 (and the back-surface-electrode seed layer 9 in the below layer thereof) can be formed to be flatter. As a result, in the semiconductor device in which a plurality of semiconductor chips are stacked, the performance can be further enhanced without deteriorating the productivity.

On the other hand, in the first structure in which the protruding portion d1 of the bump electrode 4 reaches the inside of the silicon substrate 1, the structure having the shallower back-surface electrode 6, compared with the second structure, can be obtained. This structure can further strengthen the caulking connection as described above.

Moreover, the through-electrodes having the first and second structures have the structure in which misalignment does not readily occur when a plurality of chips are stacked. This is for the reason that, in the second structure, the back-surface-electrode hole portion 7 into which the bump electrode 4 is to be fit has a wide width and that the range that can allow planar misalignment of the bump electrode 4 is wide. Since the misalignment upon connection between chips is small in this manner, the structure can be said to be suitable for miniaturization and increasing the number of pins of a semiconductor device. As a result, in the semiconductor device in which a plurality of semiconductor chips are stacked, the performance can be further enhanced without deteriorating the productivity.

Figure 24:
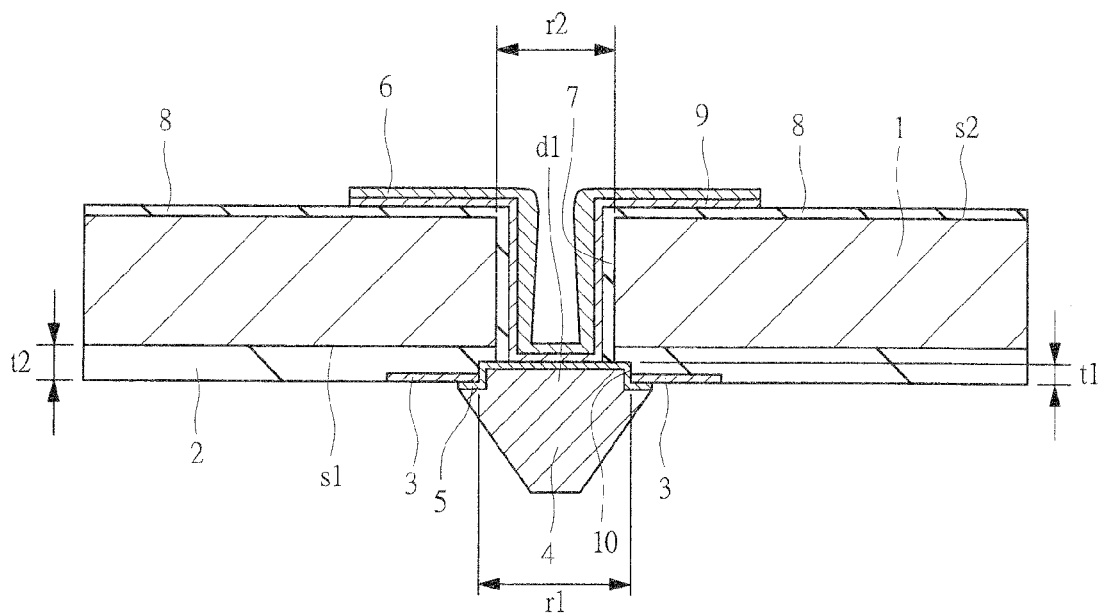
FIG. 24 is a cross-sectional view of a main part of a semiconductor device of a third structure according to the second embodiment of the present invention.

Next, a third structure will be described with reference to FIG. 24. In the third structure, the relation between the protruding-portion length t1 of the bump electrode 4 and the interlayer-film thickness t2 is the same as the above-described second structure. More specifically, the protruding-portion length t1 is smaller than the interlayer-film thickness t2. Therefore, similar to the above-described second structure, the third structure also has the effect that the inner wall of the back-surface-electrode hole portion 7 so as to be further flatter, thereby being more readily covered with the back-surface electrode 6. Furthermore, in the third structure, the protruding-portion diameter r1 of the bump electrode 4 is larger than the hole-portion diameter r2 of the back-surface-electrode hole portion 7. In other words, in the third structure, when viewed in a plan view, the back-surface-electrode hole portion 7 is formed to be within the protruding portion d1 of the bump electrode 4.

The through-electrode of the third structure can be formed as same as the through-electrode having the above-described second structure, except that the magnitude relation of the diameters of the bump-electrode hole portion 10 and the back-surface-electrode hole portion 7 is set to be the relation described above.

The through-electrode such as the third structure is the structure that does not readily cause misalignment upon formation of the electrode hole portions 7 and 10. This is for the reason that the bump-electrode hole portion 10, which is formed first, has a wide width, and that the back-surface-electrode hole portion 7 is required to be formed to be overlapped with any position of the bump-electrode hole portion 10 in a plan view. In this manner, employing the third structure to the through-electrode of the semiconductor device of the second embodiment has an advantage in terms of manufacturing method. As a result, in the semiconductor device in which a plurality of semiconductor chips are stacked, the performance can be further enhanced without deteriorating the productivity.

On the other hand, in the first and second structures in which the protruding-portion diameter r1 of the bump electrode 4 is smaller than the hole-portion diameter r2 of the back-surface-electrode hole portion 7, misalignment upon stacking of a plurality of chips does not readily occur as described above. Since the misalignment upon connection between chips is small in this manner, the structures can be said to be suitable for miniaturization and increasing the number of pins of a semiconductor device. As a result, in the semiconductor device in which a plurality of semiconductor chips are stacked, the performance can be further enhanced without deteriorating the productivity.

Figure 25:
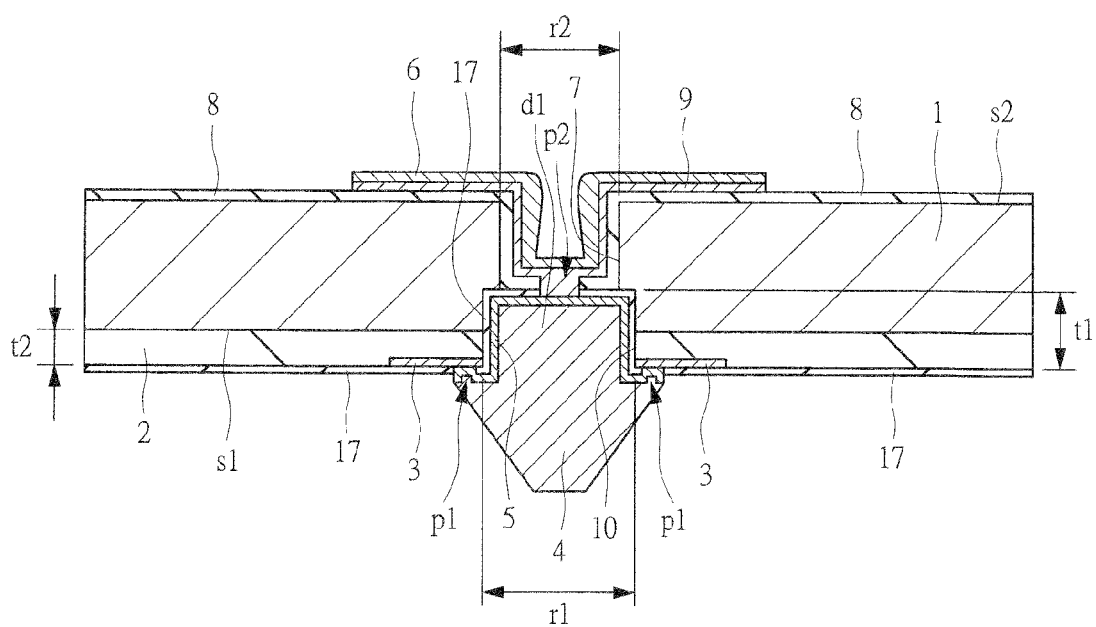
FIG. 25 is a cross-sectional view of a main part of a semiconductor device of a fourth structure according to the second embodiment of the present invention.

Next, a fourth structure will be described with reference to FIG. 25. In the fourth structure, the relation between the protruding-portion diameter r1 of the bump electrode 4 and the hole-portion diameter r2 of the back-surface-electrode hole portion 7 is the same as the above-described third structure, and the protruding-portion diameter r1 is larger than the hole-portion diameter r2. In other words, when viewed in a plan view, the back-surface-electrode hole portion 7 is formed to be within the protruding portion d1 of the bump electrode 4. Therefore, as well as the above-described third structure, the fourth structure also has the effect that misalignment upon formation of the electrode hole portions 7 and 10 does not readily occur. As a result, in the semiconductor device in which a plurality of semiconductor chips are stacked, the performance can be further enhanced without deteriorating the productivity.

Furthermore, in the fourth structure, the relation between the protruding-portion length t1 of the bump electrode 4 and the interlayer-film thickness t2 is the same as the above-described first structure, and the protruding-portion length t1 is larger than the interlayer-film thickness t2. More specifically, when viewed in a cross section, the protruding portion d1 of the bump electrode 4 penetrates through the interlayer insulating film 2 and reaches the inside of the silicon substrate 1. Therefore, similar to the above-described first structure, the fourth structure also has the effect that enables stronger caulking connection when chips are stacked and connected. As a result, in the semiconductor device in which a plurality of semiconductor chips are stacked, the performance can be further enhanced without deteriorating the productivity.

Herein, the above-described fourth structure is the structure that can be in contact with the silicon substrate 1 since the protruding portion d1 of the bump electrode 4 is not within the back-surface-electrode hole portion 7. The contact between the protruding portion d1 and the silicon substrate 1 having conductivity is a cause of generation of a leakage current. Therefore, a protective insulating film 17 has to be formed at least on the boundary part of the protruding portion d1 of the bump electrode 4 and the silicon substrate 1 so that they are not electrically connected with each other. FIG. 25 illustrates, as an example, a structure in which the protective insulating film 17 is disposed so as to integrally cover the part from the inner walls of the bump-electrode hole portion 10 to the surface of the interlayer insulating film 2, which is outside of the hole portion 10.

Meanwhile, the bump electrode 4 (the bump-electrode seed layer 5 in the below layer thereof) and the pad 3 have to be electrically connected with each other. Therefore, at a main part p1 on the pad 3, a hole is provided in the protective insulating film 17 covering the pad 3 and the pad 3 and bump electrode 4 are brought into contact with each other. Meanwhile, the bump electrode 4 (the bump-electrode seed layer 5 in the below layer thereof) and the back-surface electrode 6 (the back-surface-electrode seed layer 9 in the below layer thereof) have to be electrically connected with each other. Therefore, in this structure, at a main part p2 at the boundary part of them, a hole is provided in the protective insulating film 17, so that the bump electrode 4 and the back-surface electrode 6 are brought into contact with each other.

Figure 26:
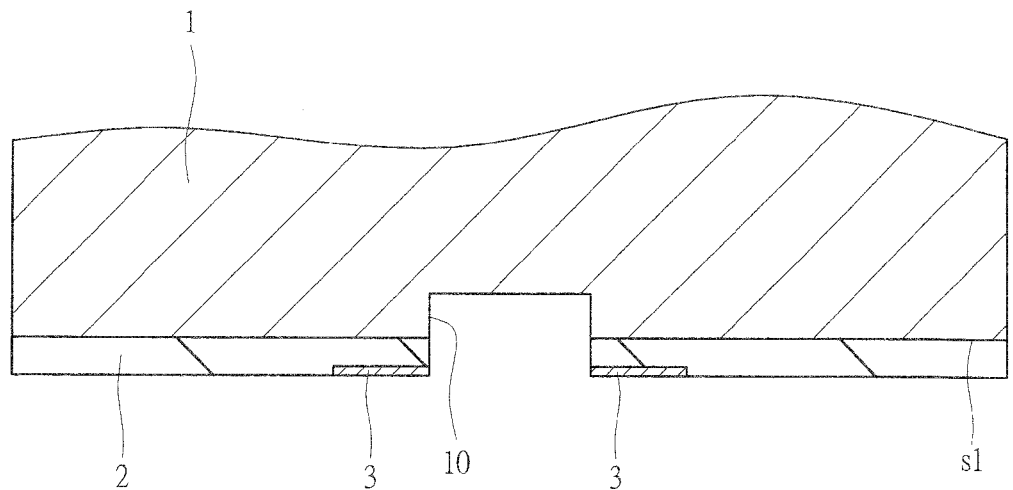
FIG. 26 is a cross-sectional view of a main part of the semiconductor device of the fourth structure according to the second embodiment of the present invention in a manufacturing step and is a cross-sectional view of the main part in a step subsequent to that of FIG. 4.

Hereinafter, a method of manufacturing the semiconductor device having the through-electrode having such fourth structure will be described. First, in the same manner as the above-described method of FIG. 4, the plurality of semiconductor elements, the interlayer insulating film 2, and the pads 3 are formed on the main surface s1 of the silicon substrate 1. Then, as illustrated in FIG. 26, the bump-electrode hole portion 10 is formed in the same manner as the above-described method of FIG. 5.

Figure 27:
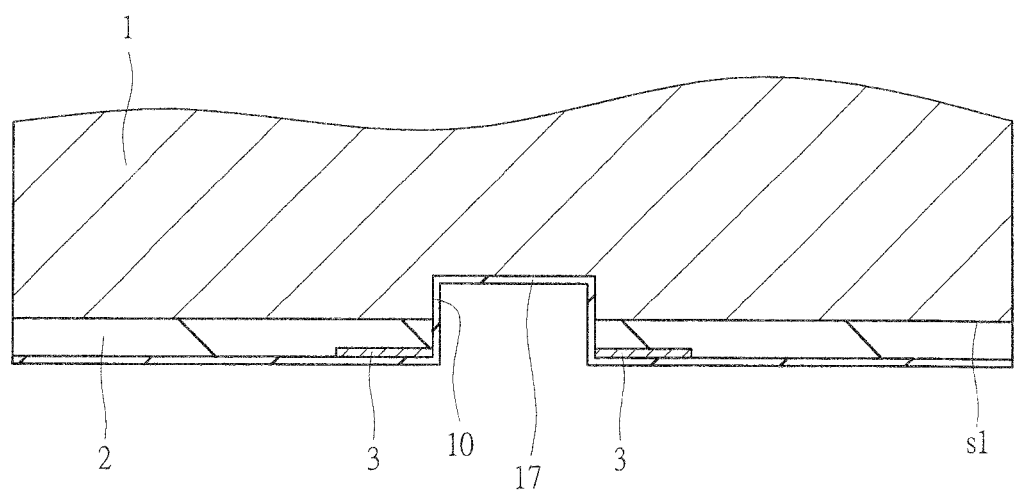
FIG. 27 is a cross-sectional view of a main part of the semiconductor device in a manufacturing step continued from FIG. 26.

Next, as illustrated in FIG. 27, the protective insulating film 17 is formed on the entire surface of the interlayer insulating film 2 including the bump-electrode hole portion 10 on the main surface s1-side of the silicon substrate 1. For example, a silicon oxide film is formed as the protective insulating film 17, for example, by a CVD method or sputtering method.

Figure 28:
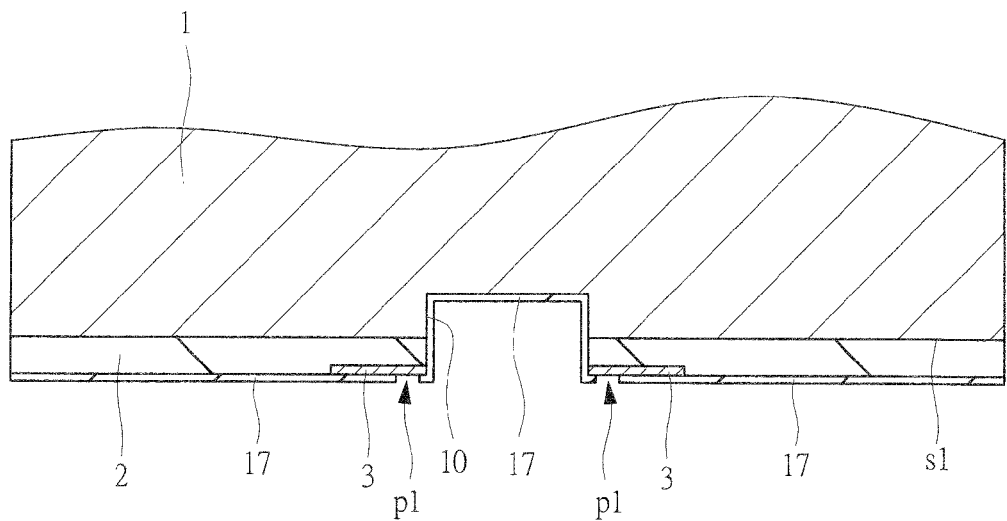
FIG. 28 is a cross-sectional view of a main part of the semiconductor device in a manufacturing step continued from FIG. 27.

Next, as illustrated in FIG. 28, a contact hole is formed to expose the pad 3 at the main part p1 which is a part of the protective insulating film 10 covering the pad 3. For example, a photolithography method or etching method is used in this process.

Figure 29:
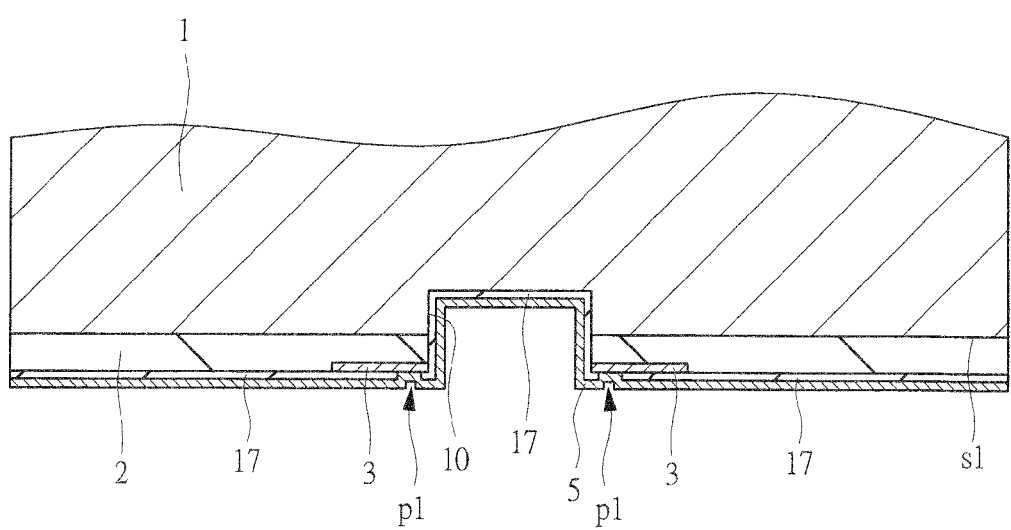
FIG. 29 is a cross-sectional view of a main part of the semiconductor device in a manufacturing step continued from FIG. 28.

Next, as illustrated in FIG. 29, the bump-electrode seed layer 5 is formed so as to cover the protective insulating film 10. The bump-electrode seed layer 5 is formed in the same manner as the above-described method of FIG. 6. At this point, the state in which the pad 3 and the bump-electrode seed layer 5 are in contact with each other via the contact hole of the protective insulating film 10 at the main part p1 formed in the above-described step of FIG. 28 is achieved.

Figure 30:
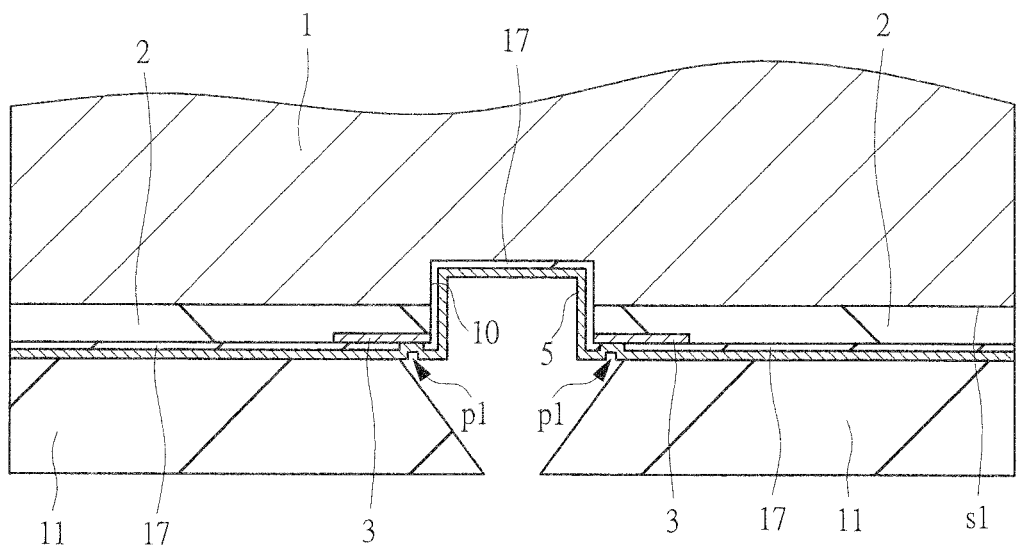
FIG. 30 is a cross-sectional view of a main part of the semiconductor device in a manufacturing step continued from FIG. 29.

Next, as illustrated in FIG. 30, in the same manner as the above-described method of FIG. 7, the photoresist film 11 is formed, and a hole having a desired shape is formed by a photolithography method. The shape of the hole is formed similarly to that in above-described FIG. 7.

Figure 31:
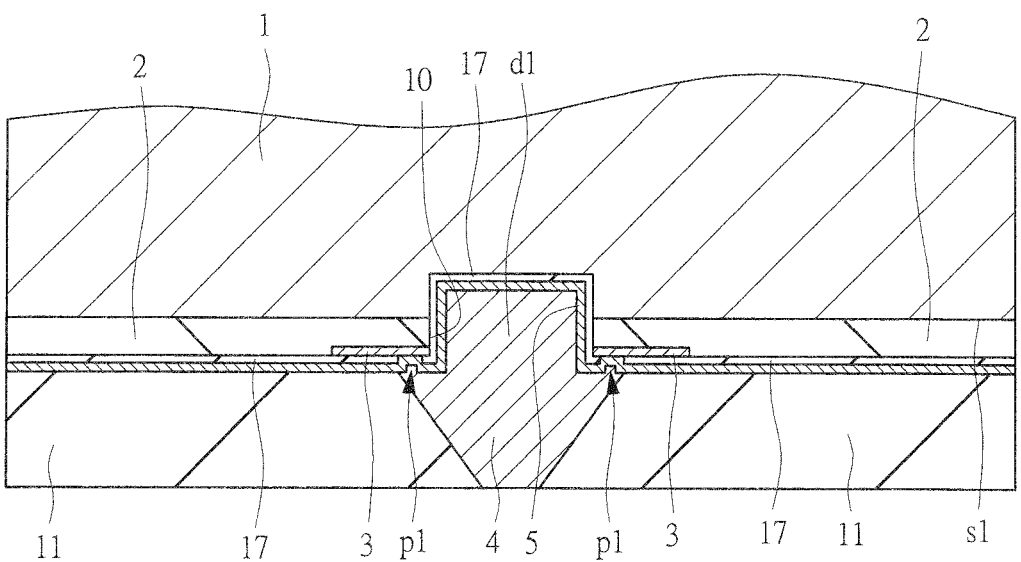
FIG. 31 is a cross-sectional view of a main part of the semiconductor device in a manufacturing step continued from FIG. 30.

Next, as illustrated in FIG. 31, the bump electrode 4 is formed by an electrolytic plating method in the same manner as the above-described method of FIG. 8. The bump electrode 4 is formed also in the bump-electrode hole portion 10, and this part serves as the protruding portion d1 of the bump electrode 4.

Figure 32:
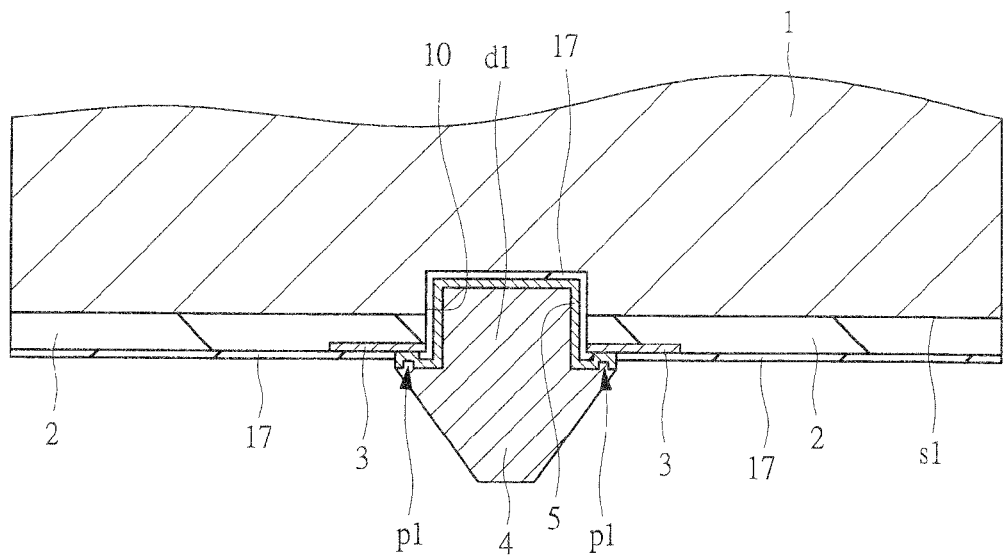
FIG. 32 is a cross-sectional view of a main part of the semiconductor device in a manufacturing step continued from FIG. 31.

Next, as illustrated in FIG. 32, in the same manner as the above-described method of FIG. 9, the exposed part of the bump-electrode seed layer 5 is removed by maskless etching. Through the above-described steps, the structure in which the protective insulating film 17 is disposed on the boundary part at which the bump electrode 4 (the bump-electrode seed layer 5) and the silicon substrate 1 can be in contact with each other can be formed.

Figure 33:
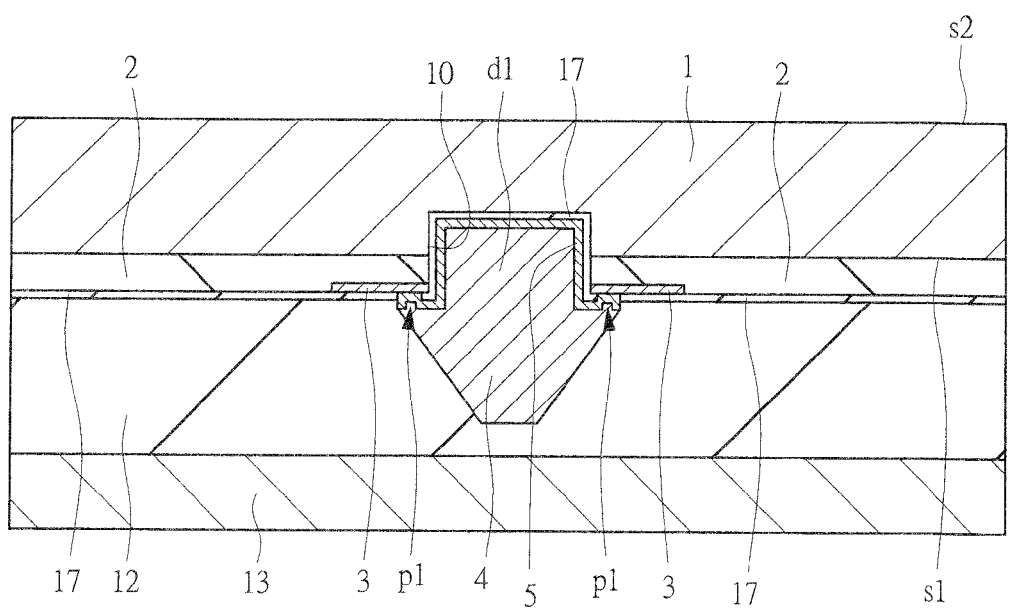
FIG. 33 is a cross-sectional view of a main part of the semiconductor device in a manufacturing step continued from FIG. 32.

Next, as illustrated in FIG. 33, in the same manner as the above-described method of FIG. 10, the adhesion layer 12 and the support wafer 13 are formed. Then, in the same manner as the above-described method of FIG. 11, the silicon substrate 1 is subjected to a back grind treatment, thereby reducing the thickness thereof; and, subsequently, the back surface s2 of the silicon substrate 1 is planarized, for example, by CMP.

Figure 34:
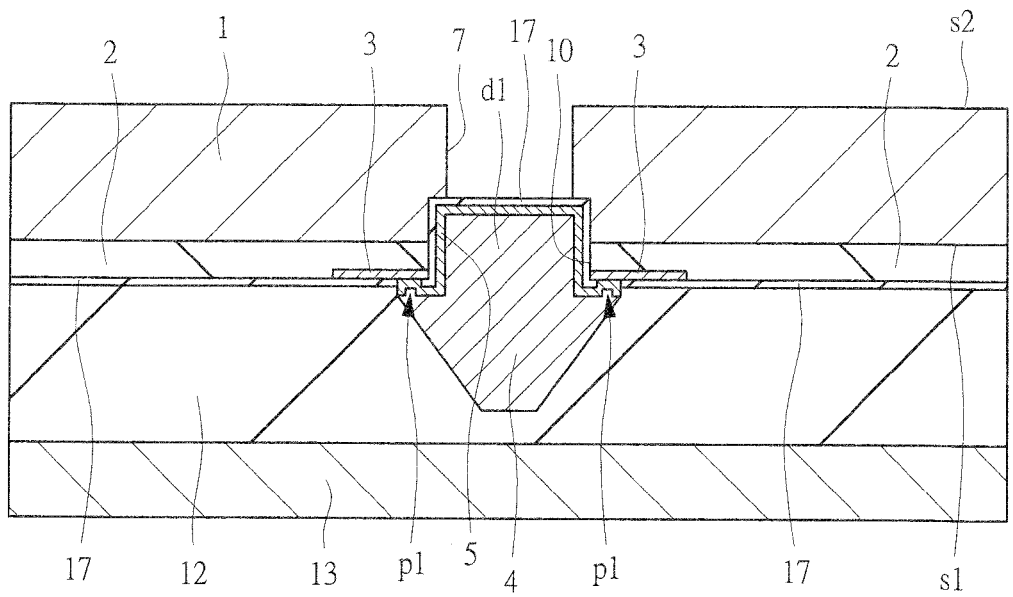
FIG. 34 is a cross-sectional view of a main part of the semiconductor device in a manufacturing step continued from FIG. 33.

Next, as illustrated in FIG. 34, in the same manner as the above-described method of FIGS. 12 and 13, the back-surface-electrode hole portion 7 is formed from the back surface s2 of the silicon substrate 1 to the bottom portion of the bump-electrode hole portion 10.

Figure 35:
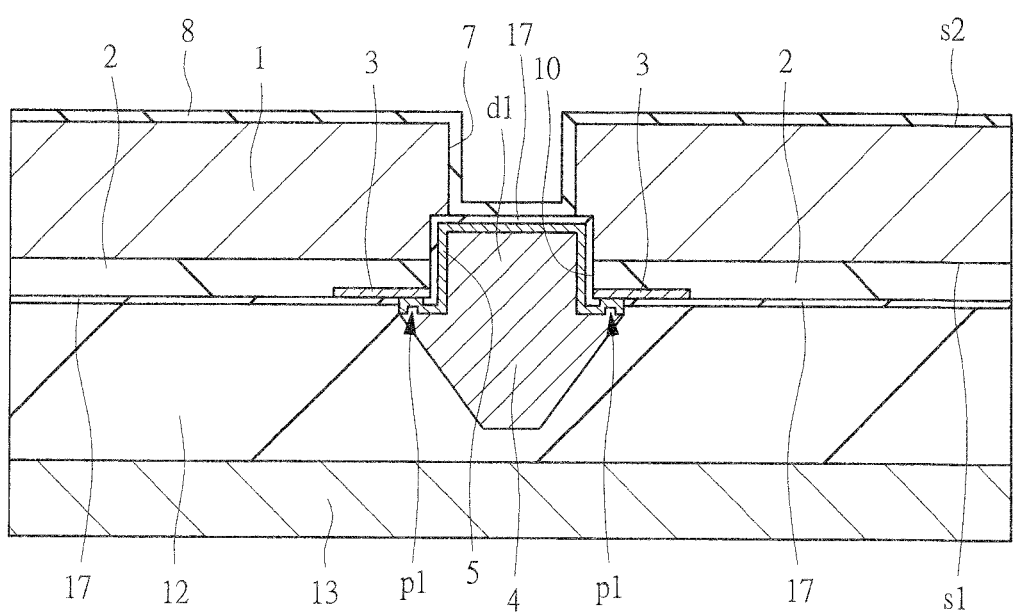
FIG. 35 is a cross-sectional view of a main part of the semiconductor device in a manufacturing step continued from FIG. 34.

Next, as illustrated in FIG. 35, in the same manner as the above-described method of FIG. 14, the insulating film 8 is formed from the back surface s2-side of the silicon substrate 1 including the back-surface-electrode hole portion 7.

Figure 36:
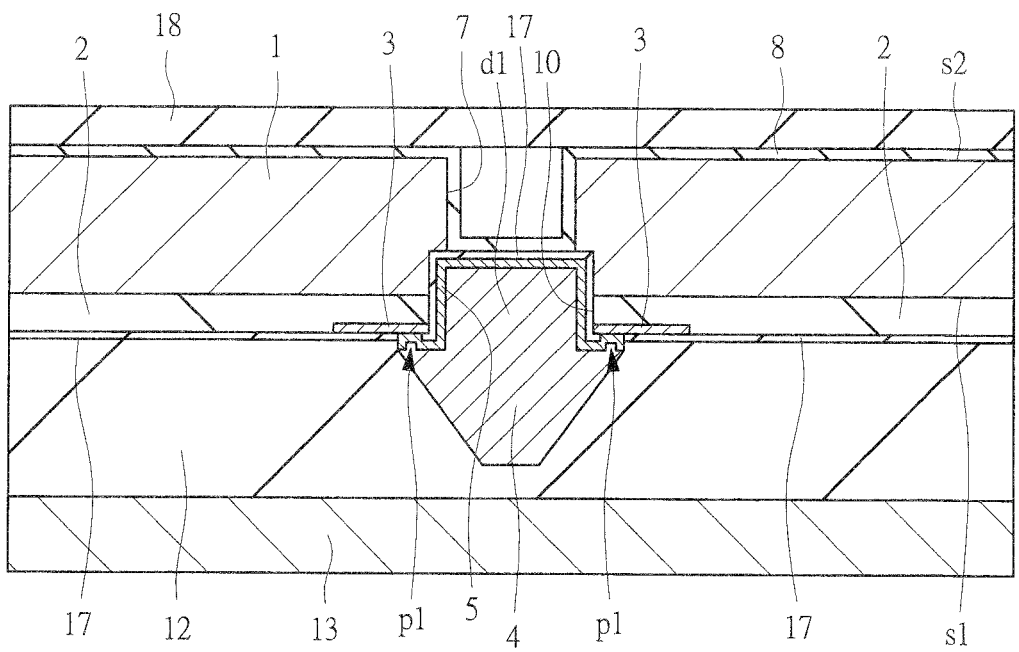
FIG. 36 is a cross-sectional view of a main part of the semiconductor device in a manufacturing step continued from FIG. 35.

Next, as illustrated in FIG. 36, a photoresist film 18 is formed on the back surface s2-side of the silicon substrate 1. In this process, the photoresist film 18 is spin-coated by using, for example, a spinner. In this process, the photoresist film 18 is formed to be prevented from entering the inside of the back-surface-electrode hole portion 7 by selecting the type and application conditions of the photoresist film 18.

Figure 37:
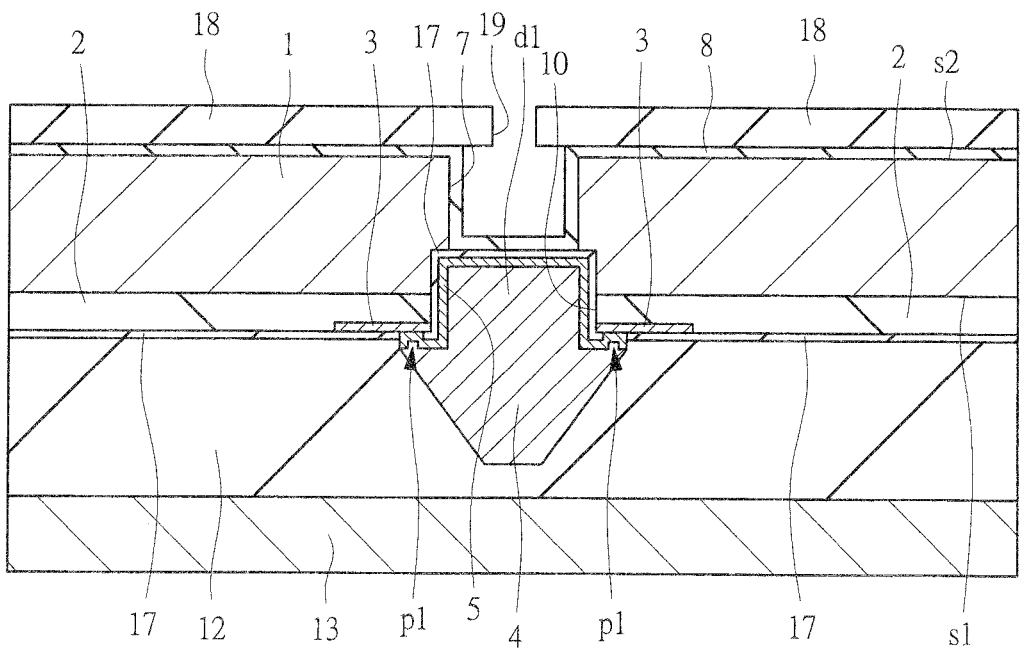
FIG. 37 is a cross-sectional view of a main part of the semiconductor device in a manufacturing step continued from FIG. 36.
Figure 38:
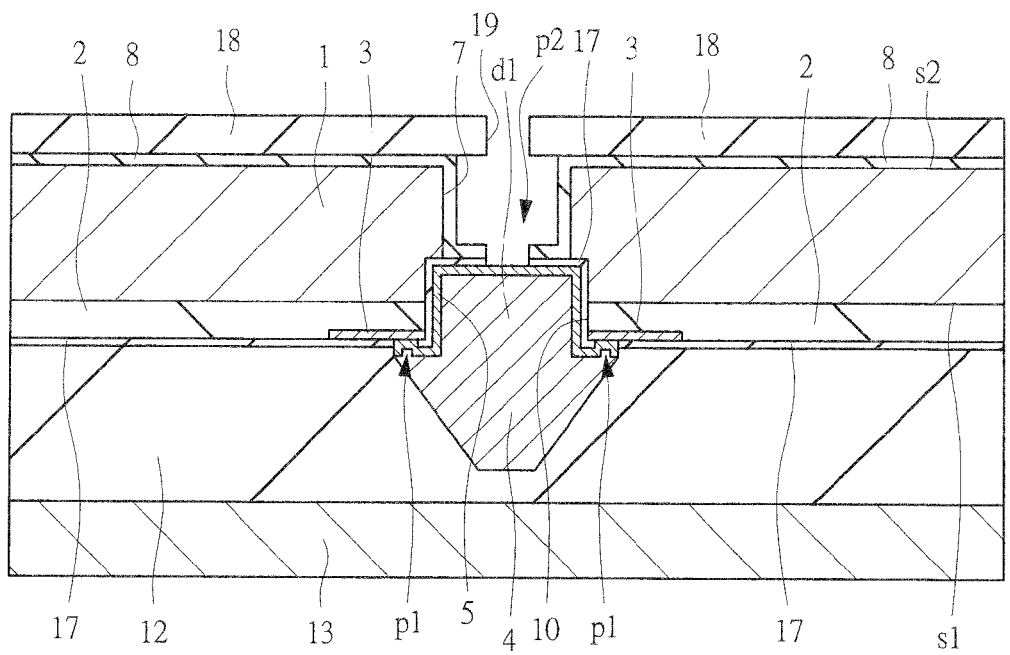
FIG. 38 is a cross-sectional view of a main part of the semiconductor device in a manufacturing step continued from FIG. 37.

Next, as illustrated in FIG. 37, the photoresist film 18 applied in the previous step is subjected to exposure and development, thereby providing a hole portion 19 in the photoresist film 18. In this process, when viewed in a plan view, the hole portion 19 is formed at a position inside the back-surface-electrode hole portion 7. Then, as illustrated in FIG. 38, while using the photoresist film 18 as an etching mask, the insulating film 8 and the protective insulating film 17 in the below layer thereof are subjected to anisotropic etching to be removed. As a result, the bump-electrode seed layer 5, which constitutes the bump electrode 4, is exposed at the main part p2 at the bottom of the back-surface-electrode hole portion 7. Then, the photoresist film 18 is removed by an organic solvent such as acetone or oxygen ashing.

In the present step, as described with reference to above-described FIG. 36, the photoresist film 18 is applied not to enter the inside of the back-surface-electrode hole portion 7. As a result, when the photoresist film 18 is removed in the above-described step of FIG. 38, the step in which the resist film does not readily remain in the inside of the hole can be carried out without the need of actively cleaning the inside of the back-surface-electrode hole portion 7. The state in which the resist film remains in the hole can be a cause of defective etching in a later step or a cause of peel-off of the electrode. Therefore, by virtue of the present step, the semiconductor device having a higher reliability can be formed.

Figure 39:
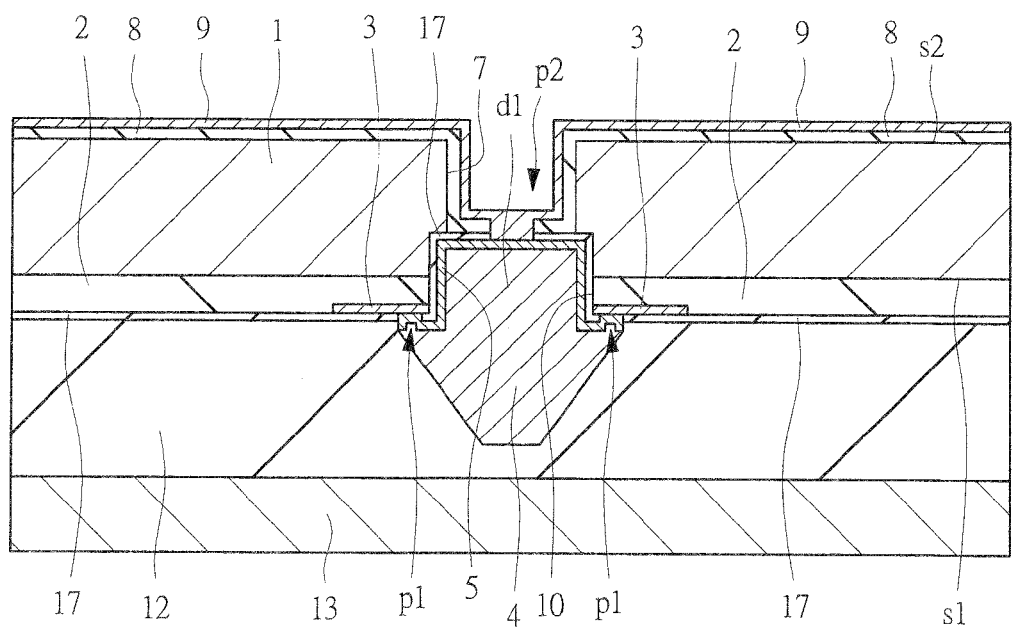
FIG. 39 is a cross-sectional view of a main part of the semiconductor device in a manufacturing step continued from FIG. 38.

In a subsequent step, as illustrated in FIG. 39, in the same manner as the above-described method of FIG. 10, the back-surface-electrode seed layer 9 is formed from the back surface s2-side of the silicon substrate 1 including the inner surface of the back-surface-electrode hole portion 7. In this step, the bump-electrode seed layer 5 and the back-surface-electrode seed layer 9 are brought into contact with each other at the main part p2 at which the insulating film 8 and the protective insulating film 17 are removed in the previous step and the bump-electrode seed layer 5 is exposed.

Figure 40:
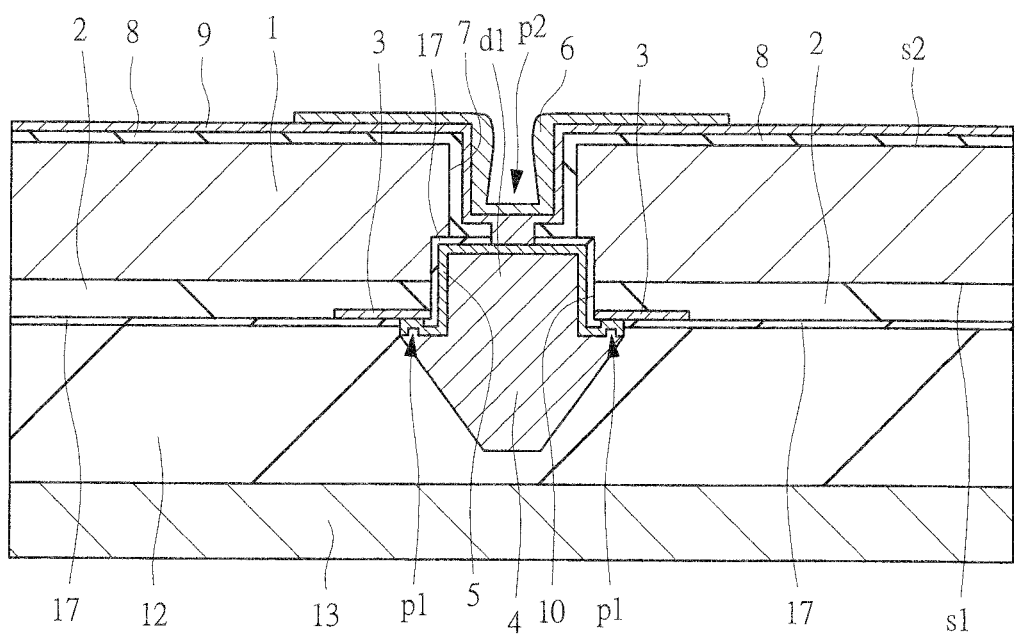
FIG. 40 is a cross-sectional view of a main part of the semiconductor device in a manufacturing step continued from FIG. 39.

Next, as illustrated in FIG. 40, in the same manner as the method of above-described FIG. 17, the back-surface electrode 6 is formed. In this process, at the main part p2 in the back-surface-electrode hole portion 7, the back-surface electrode 6 and the bump electrode 4 are electrically connected with each other via the back-surface-electrode seed layer 9 and the bump-electrode seed layer 10, and thus the through-electrode structure can be formed.

Figure 41:
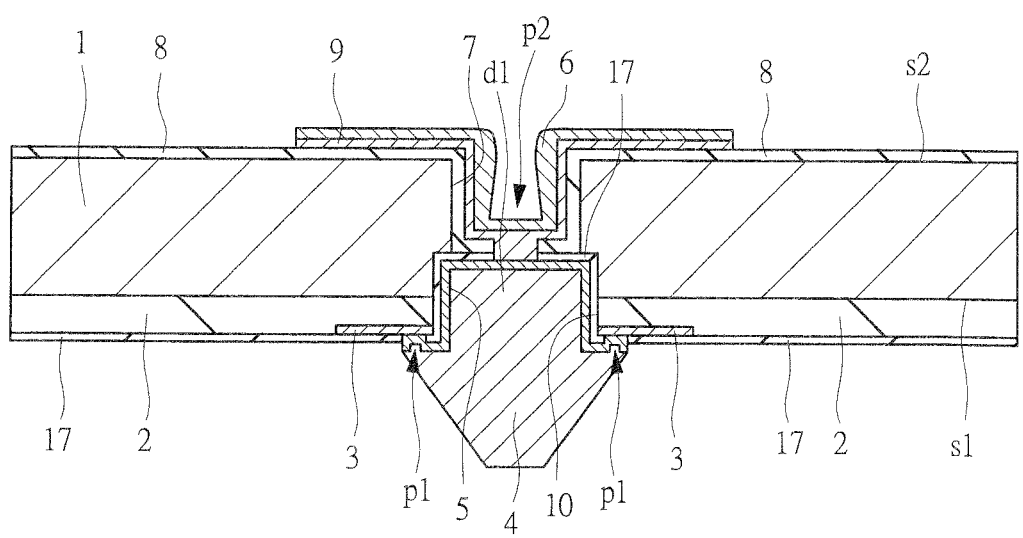
FIG. 41 is a cross-sectional view of a main part of the semiconductor device in a manufacturing step continued from FIG. 40.

Next, as illustrated in FIG. 41, in the same manner as the method of above-described FIGS. 18 and 19, the back-surface-electrode seed layer 9 is processed. The semiconductor device having the through-electrode having the fourth structure of the second embodiment can be formed by the above steps.

Meanwhile, the structure in which the protective insulating film 17 is provided to the lower part of the bump electrode 4 and the bump-electrode seed layer 5 like the through-electrode of the above-described fourth structure may be employed for another configuration. Examples will be given below.

Figure 42:
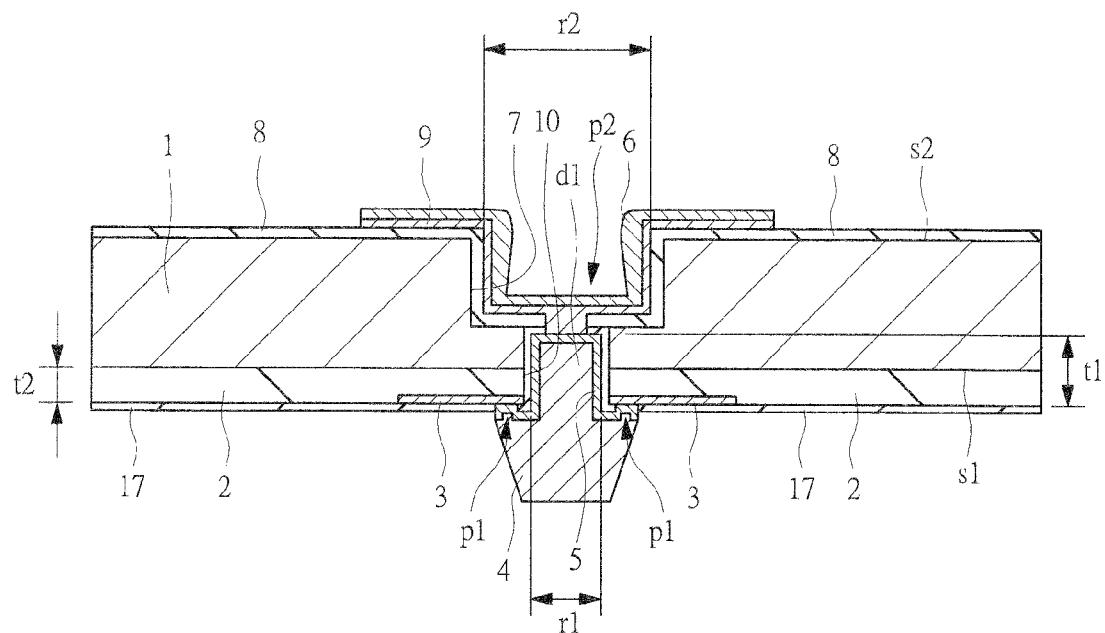
FIG. 42 is a cross-sectional view of a main part of another semiconductor device according to the second embodiment of the present invention.

As illustrated in FIG. 42, the protective insulating film 17 as described above may be provided to the structure in which the protruding-portion diameter r1 of the bump electrode 4 is smaller than the hole-portion diameter r2 of the back-surface electrode 6, and the protruding-portion length t1 of the bump electrode 4 is larger than the interlayer-film thickness t2 of the interlayer insulating film 2. Also in this through-electrode structure, the caulking connection force is improved as the bottom level of the back-surface-electrode hole portion 7 is raised.

Figure 43:
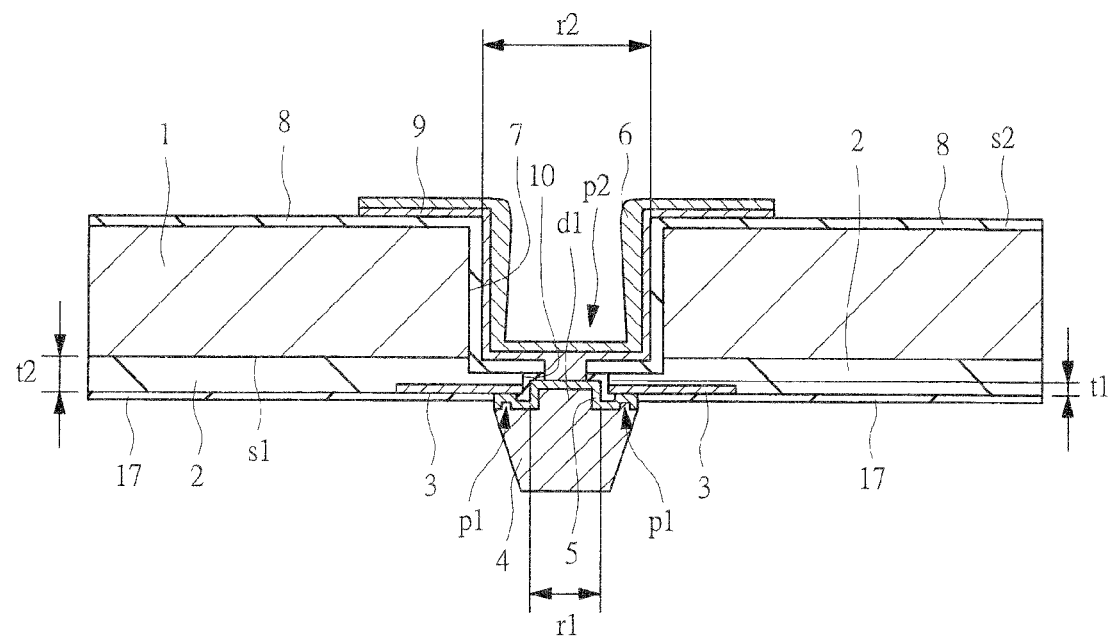
FIG. 43 is a cross-sectional view of a main part of still another semiconductor device according to the second embodiment of the present invention.

Also, as illustrated in FIG. 43, the protective insulating film 17 as described above may be provided to the structure in which the protruding-portion diameter r1 of the bump electrode 4 is smaller than the hole-portion diameter r2 of the back-surface electrode 6, and the protruding-portion length t1 of the bump electrode 4 is smaller than the interlayer-film thickness t2 of the interlayer insulating film 2.

Figure 44:
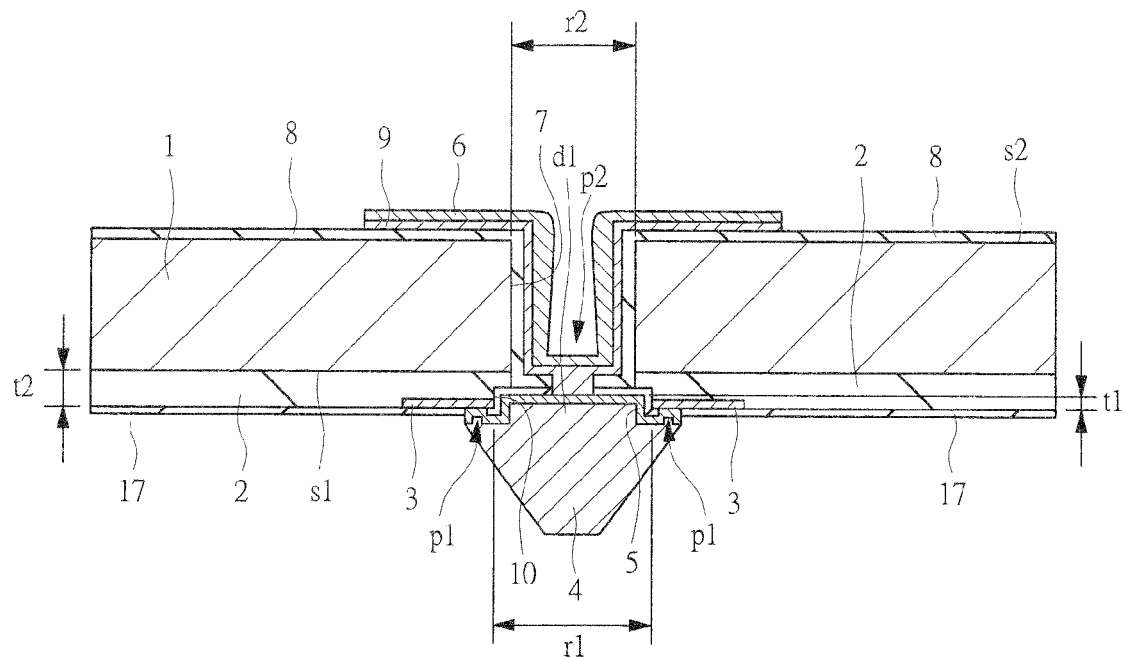
FIG. 44 is a cross-sectional view of a main part of still another semiconductor device according to the second embodiment of the present invention.

Also, as illustrated in FIG. 44, the protective insulating film 17 as described above may be provided to the structure in which the protruding-portion diameter r1 of the bump electrode 4 is larger than the hole-portion diameter r2 of the back-surface electrode 6, and the protruding-portion length t1 of the bump electrode 4 is smaller than the interlayer-film thickness t2 of the interlayer insulating film 2.

On the other hand, compared with the fourth structure and the modification examples thereof, the protective insulating film 17 as described above is not required to be formed in the above-described first, second, and third structures since the protruding portion d1 of the bump electrode 4 and the silicon substrate are not in contact in these structures. From this point of view, as to the first, second, and third structures, the number of manufacturing steps for formation and processing of the protective insulating film 17 as described above can be reduced. As a result, in the semiconductor device in which a plurality of semiconductor chips are stacked, the performance can be further enhanced without deteriorating the productivity.

Third Embodiment

A semiconductor device of a third embodiment will be described with reference to FIG. 45. The semiconductor device of the third embodiment has a configuration in which a plurality of semiconductor chips having through-electrodes like those of the above-described first and second embodiments are stacked. Herein, the semiconductor chips are stacked in the manner as described with reference to above-described FIG. 20.

Figure 45:
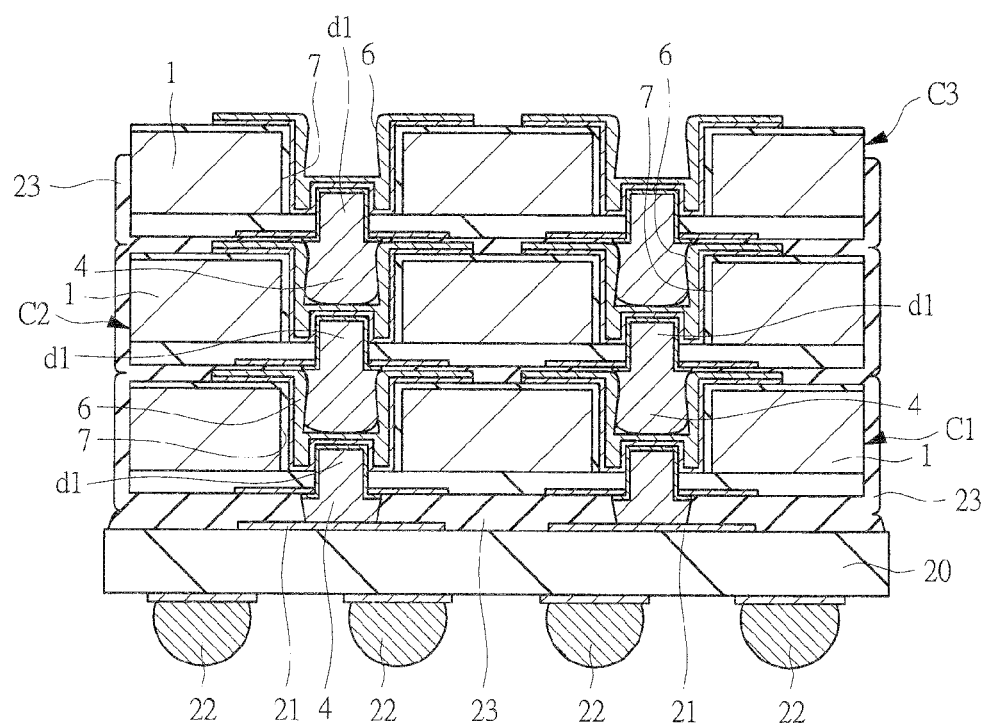
FIG. 45 is a cross-sectional view of a main part of a semiconductor device according to a third embodiment of the present invention.

FIG. 45 illustrates the semiconductor device including the stacked plurality of chips (first chip C1, second chip C2, and third chip C3) having the through-electrodes of the third embodiment. The chips are mutually connected by physical caulking by injecting and pressure-welding the bump electrode 4 formed on an upper-level chip (for example, the second chip C2) into and with the hollow back-surface-electrode hole portions 7 formed in a lower-level chip (for example, the first chip C1). The bump electrodes 4 of the chip of the lowermost layer (in this case, the first chip C1) are joined with electrodes 21 of a wiring board 20, thereby achieving the state in which the chip is electrically connected with the wiring board 20. Moreover, solder bumps 22 are formed on the lower side of the wiring board 20 and are used for connection with outside. The solder bumps 22 are electrically connected with the electrodes 21 of the wiring board 20 via internal wiring (not illustrated), etc. of the wiring board 20. In other words, the chips C1, C2, and C3 are electrically connected mutually via the through-electrodes and are further electrically connected with the solder bumps 22 via the electrodes 21 of the wiring board 20.

After the chips are stacked on the wiring board 20, the gaps of the plurality of chips (first chip C1, second chip C2, and third chip C3) and the wiring board 20 is filled with an underfill resin 23. As a result, the mechanical strength is enlarged so as to enhance the handling ability, and the device is protected from the external environment.

In the semiconductor device having the above-described configuration, different effects can be exerted depending on the outer shape of the bump electrode 4 or the outer shape of the back-surface-electrode hole portion 7. Hereinafter, the effects brought about to the semiconductor device by the difference in the outer shapes will be described in detail. First, the outer shape of the corresponding bump electrode 4 and the outer shape of the back-surface-electrode hole portion 7 will be described with reference to FIG. 46. Since the back-surface-electrode hole portion 7 is covered with the back-surface electrode 6 in practice, hereinafter, when the outer shape of the back-surface-electrode hole portion 7 is referred to, it expresses the outer shape formed by the back-surface electrode 6 covering the outer shape the back-surface-electrode hole portion 7.

Figure 46A:
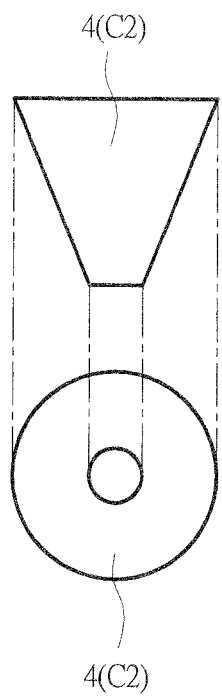
FIG. 46A illustrates the semiconductor device according to the third embodiment of the present invention and is an explanatory diagram illustrating a structure of a bump electrode.
Figure 46B:
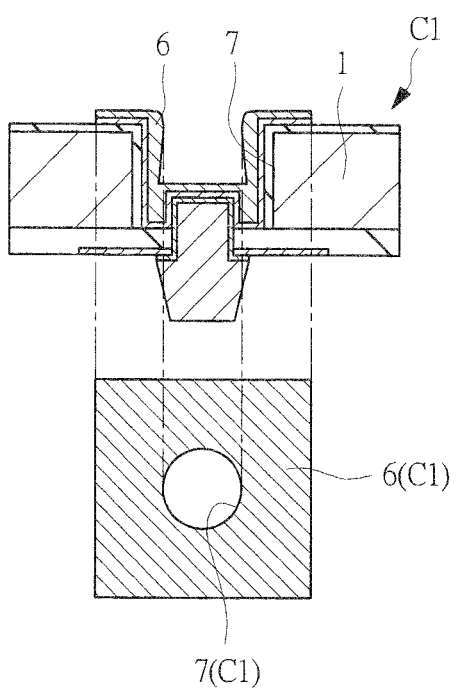
FIG. 46B illustrates the semiconductor device according to the third embodiment of the present invention and is an explanatory diagram illustrating a structure of a back-surface electrode.

FIG. 46A is an explanatory diagram describing the outer shape of the bump electrode 4. A cross-sectional view of the part of the bump electrode 4 exposed above the pad 3 is illustrated on the top, and a plan view of the bump electrode 4 is illustrated on the bottom. As described above, when viewed in the cross section, the sidewall of the bump electrode 4 has the inclination which makes the width increase (diameter of the bump electrode 4 is increased) toward the silicon substrate 1. Meanwhile, when viewed in the plan view, the bump electrode 4 is circular. FIG. 46B is an explanatory diagram describing the outer shape of the back-surface-electrode hole portion 7. A cross-sectional view of the through-electrode including the back-surface electrode 6 is illustrated on the top, and a plan view of the periphery of the back-surface-electrode hole portion 7 is illustrated on the bottom. The shape of the perimeter of the opening portion of the back-surface-electrode hole portion 7 is circular when viewed in the plan view. Herein, as to the inclined surface forming the sidewall of the bump electrode 4, the diameter of the bottom portion, which is the widest, is larger than the diameter of the back-surface-electrode hole portion 7.

Figure 47:
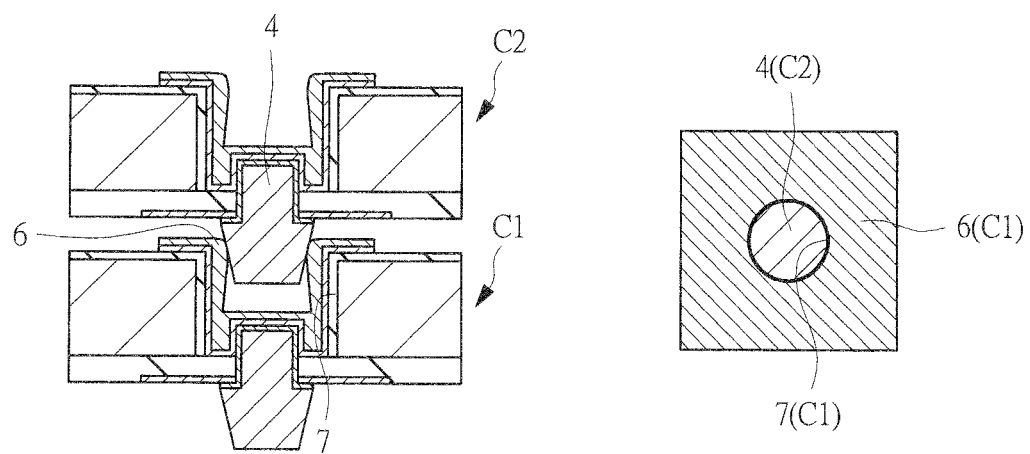
FIG. 47 illustrates the semiconductor device according to the third embodiment of the present invention, wherein an explanatory diagram illustrating a connection state is illustrated on the left side, and an explanatory diagram illustrating a joint between the back-surface electrode and the bump electrode is illustrated on the right side.

FIG. 47 is an explanatory diagram explaining the state in which both the chips C1 and C2 are electrically connected to each other by inserting the bump electrode 4 of the second chip C2 into the back-surface-electrode hole portion 7 of the first chip C1. A cross-sectional view of the chips is illustrated on the left side, and a plan view of the periphery of the back-surface-electrode hole portion 7 of the first chip C1 is illustrated on the right side. As is understood from FIG. 47, when both the chips C1 and C2 are to be connected with each other, the inclined surface forming the sidewall of the bump electrode 4 of the second chip C2 is brought into contact with the circumferential part forming the bore of the back-surface-electrode hole portion 7 of the first chip C1 and covers the inside of the back-surface-electrode hole portion 7. In this state, the bump electrode 4 is further thrust into the back-surface-electrode hole portion 7 (see above-described FIG. 45), thereby achieving a caulking connection.

Particularly, like the above-described example, when the shape of the perimeter of the opening portion of the back-surface-electrode hole portion 7 of the first chip C1 and the planar shape of the bump electrode 4 are the same circular shape, the back-surface-electrode hole portion 7 is sealed by the bump electrode 4 in the process of carrying out the caulking connection.

Figure 48A:
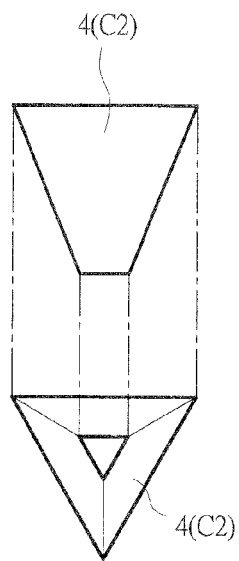
FIG. 48A is an explanatory diagram illustrating the semiconductor device according to the third embodiment of the present invention illustrating a structure of the bump electrode having a triangular shape in a plane and a joint between the structure and the back-surface electrode.
Figure 48B:
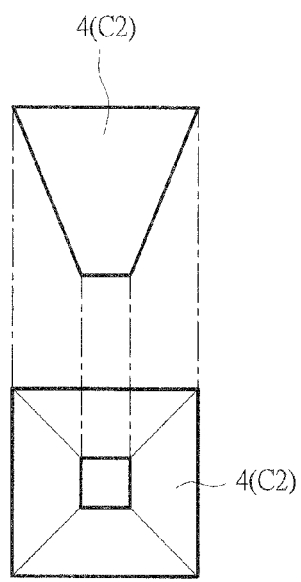
FIG. 48B is an explanatory diagram illustrating the semiconductor device according to the third embodiment of the present invention illustrating a structure of the bump electrode having a rectangular shape in a plane and a joint between the structure and the back-surface electrode.
Figure 48C:
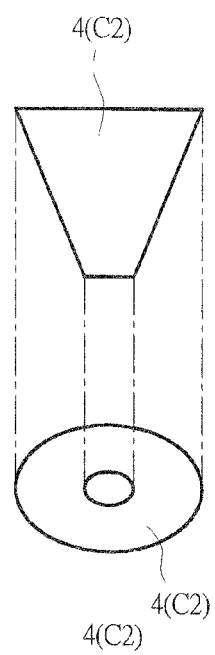
FIG. 48C is an explanatory diagram illustrating the semiconductor device according to the third embodiment of the present invention illustrating a structure of the bump electrode having an oval shape in a plane and a joint between the structure and the back-surface electrode.
Figure 48C:
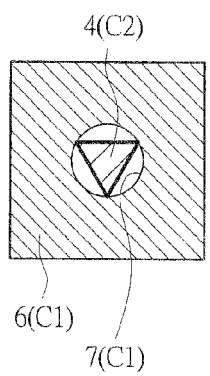
Figure 48C:
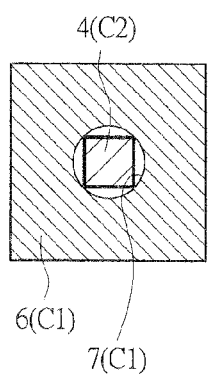
Figure 48C:
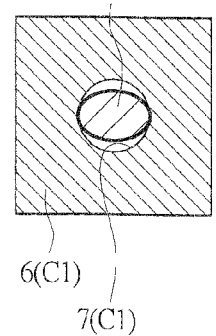

FIGS. 48A, 48B, and 48C illustrate the bump electrodes 4 having shapes other than a precise circle (for example, polygonal shape, oval shape, etc.) as the planar shape thereof. FIG. 48A illustrates an example of a triangular shape, FIG. 48B illustrates an example of a rectangular shape, and FIG. 48C illustrates an example of an oval shape. In each of the cases, if the shape of the perimeter of the opening portion of the back-surface-electrode hole portion 7 of the first chip C1 is a precise circular shape, sealing of the hole like above-described FIG. 47 is not made. This is for the reason that the opening portion of the back-surface-electrode hole portion 7 of the first chip C1 and the sidewall surface of the bump electrode 4 of the second chip C2 are in contact with each other by points, and gaps are generated between them. This is caused since the shape of the perimeter of the opening portion of the back-surface-electrode hole portion 7 of the first chip C1 and the planar shape of the bump electrode 4 of the second chip C2 are different from each other. In FIGS. 48A, 48B, and 48C, the triangular shape and the rectangular shape are illustrated as examples of the bump electrode 4 having a polygonal shape as the planar shape thereof. However, similar effects can be obtained even when the bump electrode 4 has a polygonal shape of a higher order. In that case, the bump electrode 4 of the second chip C2 is brought into contact with the perimeter of the opening portion of the back-surface-electrode hole portion 7 of the first chip C1 by more points.

Similar effects can be also obtained when the planar shape of the perimeter of the opening portion of the back-surface-electrode hole portion 7 has a shape other than the precise circle (for example, polygonal shape, oval shape, etc.). Examples of the shapes are illustrated in FIGS. 49A and 49B. FIG. 49A illustrate an example in which the shape of the perimeter of the opening portion of the back-surface-electrode hole portion 7 of the first chip C1 is a rectangular shape and FIG. 49B illustrates an example of an example oval shape. In each of the examples, if the planar shape of the bump electrode of the second chip C2 is a precise circular shape, the sealing of the inside of the hole as above-described FIG. 47 is not made. The reason is the same as that explained in above-described FIGS. 48A-49C. In FIGS. 49A and 49B, the rectangular shape is illustrated as an example of the planar shape of the back-surface-electrode hole portion 7 having a polygonal shape as the planar shape. However, similar effects can be exerted even when the shape is a triangular shape or a polygonal shape of a higher order. In the example of the polygonal shape of a higher order, the perimeter of the opening portion of the back-surface-electrode hole portion 7 of the first chip C1 is brought into contact with the bump electrode 4 of the second chip C2 by more points.

For example, when sealing of the inside of the hole as illustrated in above-described FIG. 47 is made when the plurality of chips having the through-electrode structures are subjected to caulking connection, the underfill resin 23 illustrated in above-described FIG. 45 does not enter the inside of the back-surface-electrode hole portion 7, and air remains in the inside of the through-electrode.

On the other hand, sealing in the back-surface-electrode hole portion 7 is prevented by applying the back-surface electrode having any of the structures described with reference to above-described FIGS. 48A, 48B, and 48C and FIGS. 49A and 49B like the semiconductor device of the third embodiment. More specifically, gaps are generated between the back-surface electrode 6 of the first chip C1 and the bump electrode 4 of the second chip C2. Therefore, when the underfill resin 23 flows in, the air in the back-surface-electrode hole portion 7 is pushed out, and the underfill resin 23 can be filled therein. Moreover, compared with the case in which the back-surface electrode 6 and the bump electrode 4 are in close contact with each other, the contacting area upon the caulking connection is reduced when they are in contact with each other by points like the third embodiment, and the caulking connection can be made even with a low load. As a result, in the semiconductor device in which a plurality of semiconductor chips are stacked, the performance can be further enhanced without deteriorating the productivity.

The firmness of the caulking connection can be varied also by the inclination angle of the sidewall of the bump electrode 4. In relation to this, description will be given with reference to FIGS. 50A and 50B. As described above, the bump electrode 4 has a tapered shape, in which the sidewall thereof is inclined, at the part exposed above the pad 3.

FIG. 50A illustrates a structure in which the sidewall of the bump electrode 4 of the second chip C2 has a low-inclination tapered shape. In the semiconductor device of the third embodiment, the sidewall of the bump electrode 4 being the low inclination means that a taper angle v1 which is the angle formed by the sidewall of the bump electrode 4 and the main surface s1 of the silicon substrate 1 is larger than or equal to 45 degrees and smaller than 70 degrees. FIG. 50B illustrates a structure in which the sidewall of the bump electrode 4 of the second chip C2 has a tapered shape with a steep inclination. In the semiconductor device of the third embodiment, mentioning that the sidewall of the bump electrode 4 having a steep inclination means that a taper angle v2 which is the angle formed by the sidewall of the bump electrode 4 and the main surface s1 of the silicon substrate 1 is larger than or equal to 70 degrees and smaller than 90 degrees.

When the tapered shape of the sidewall of the bump electrode 4 has a low inclination, the tip diameter of the bump electrode 4 can be reduced; therefore, misalignment between chips upon chip connection does not readily occur. Moreover, in this case, the contact area between the bump electrode 4 and the back-surface electrode 6 upon the caulking connection is small. Therefore, the load for joint required for the caulking connection can be further reduced.

On the other hand, when the tapered shape of the sidewall of the bump electrode 4 has the steep inclination, the contact area between the bump electrode 4 and the back-surface electrode 6 upon the caulking connection is increased. Therefore, among the plurality of chips stacked by the caulking connection, the joint force can be increased. Note that the bump electrode 4 having a columnar shape in which the bump upper-surface size and the bump lower-surface size are the same has similar characteristics as the case in which the tapered shape of the sidewall of the bump electrode 4 has a steep inclination.

To change the taper angles v1 and v2 of the sidewall of the bump electrode 4, in the manufacturing method described with reference to above-described FIG. 7, etc., the outer shape of the pattern is changed by changing the temperature inclination upon heating of the photoresist film 11, thereby arbitrarily controlling the taper angles v1 and v2.

In the semiconductor device in which chips having the through-electrode structures are mutually stacked and subjected to caulking connection, there are requirements to reduce the load required for joint or to increase the joint force and so forth. In relation to these, as described above, according to the semiconductor device of the third embodiment, these factors can be arbitrarily adjusted by changing the shapes of the bump electrode 4 and the back-surface-electrode hole portion 7 in a plan view or by changing the taper angles v1 and v2 of the inclined sidewall of the bump electrode 4. More specifically, when the load for the joint of the caulking connection is to be reduced, there is a method in which the shape of the bump electrode 4 or the back-surface-electrode hole portion 7 in a plan view is changed to, for example, a polygonal shape or a method in which the taper angles v1 and v2 of the sidewall of the bump electrode 4 are caused to have a low inclination. Also, when the joint force of the caulking connection is to be increased, there is a method in which the planar shapes of the bump electrode 4 and the back-surface-electrode hole portion 7 are changed to similar precise circular shapes, or a method in which the taper angles v1 and v2 of the sidewall of the bump electrode 4 is caused to have a steep inclination.

In this manner, according to the semiconductor device according to the third embodiment, the load required for joint of the semiconductor chips having the through-electrodes and the joint force thereof can be arbitrarily adjusted. As a result, in the semiconductor device in which a plurality of semiconductor chips are stacked, the performance can be further enhanced without deteriorating the productivity.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, in the above-described third embodiment, the structure in which the shape of the bump electrode 4 or the back-surface-electrode hole portion 7 is changed and the structure in which the taper angles v1 and v2 of the sidewall of the bump electrode 4 are changed are separately illustrated. These configurations are more effective when used together.

The present invention is applicable to the semiconductor industry necessary for carrying out information processing, for example, in personal computer, mobile devices, etc.

What is claimed is:

1. A semiconductor device comprising:
   a semiconductor substrate having a main surface and a back surface positioned on an opposite side to the main surface;
   a first insulating film formed on the main surface of the semiconductor substrate;
   a first hole formed in the first insulating film;
   a second hole formed in the back surface of the semiconductor substrate;
   a bump electrode disposed over the first insulating film and having a protruding portion which is formed at least in the first hole and which reaches the inside of the semiconductor substrate in a cross-sectional view;
   a second insulating film formed on a side surface of the second hole; and
   a conductive film formed in the second hole and electrically connected to the bump electrode,
   wherein, in a planar view, a diameter of the protruding portion is smaller than a diameter of the second hole; and
   wherein the conductive film is connected to a side surface and a bottom surface of the protruding portion;
   wherein the first hole is entirely filled with the bump electrode; and
   wherein the second hole is not entirely filled with the conductive film.

2. The semiconductor device according to claim 1, wherein a protective insulating film is formed at a boundary portion between the bump electrode and the semiconductor substrate so that the bump electrode and the semiconductor substrate are electrically insulated to each other.

3. The semiconductor device according to claim 1, wherein, in a planar view, a shape of a perimeter of the second hole is circular and a shape of the bump electrode is polygonal.

4. The semiconductor device according to claim 1, wherein, in a planar view, a shape of a perimeter of the second hole is polygonal and a shape of the bump electrode is circular.

5. The semiconductor device according to claim 1, wherein the bump electrode has a shape in which a sidewall has an inclination at a portion exposed above the second insulating film.

6. The semiconductor device according to claim 5, wherein the bump electrode has an inclination at an angle greater than or equal to 45 degrees to less than 70 degrees at a portion exposed above the second insulating film.

7. The semiconductor device according to claim 5, wherein the bump electrode has an inclination at an angle greater than or equal to 70 degrees to less than 90 degrees at a portion exposed above the second insulating film.

8. The semiconductor device according to claim 1,
   wherein a pad is formed between the first insulating film and the bump electrode, and
   wherein the second hole does not reach the pad.

9. The semiconductor device according to claim 1,
   wherein the bump electrode includes a first seed layer and a first metal film,
   wherein the first seed layer includes Ti or TiW, and
   wherein the first metal film includes Au, Cu, Al or Ni.

10. The semiconductor device according to claim 9,
    wherein the conductive film includes a second seed layer and a second metal film,
    wherein the second seed layer includes Ti and Au, or Cr and Au, and
    wherein the second metal film includes Au, Cu, Al or Ni.

11. A semiconductor device comprising:
    a semiconductor substrate having a main surface and a back surface positioned on an opposite side to the main surface;
    a first insulating film formed on the main surface of the semiconductor substrate;
    a first hole formed in the first insulating film;
    a second hole formed in the back surface of the semiconductor substrate;
    a bump electrode disposed over the first insulating film and having a protruding portion which is formed at least in the first hole and which reaches the inside of the semiconductor substrate in a cross-sectional view;
    a second insulating film formed on a side surface of the second hole; and
    a conductive film formed in the second hole and electrically connected to the bump electrode,
    wherein, in a planar view, a diameter of the protruding portion is smaller than a diameter of the second hole;
    wherein the conductive film is connected to a side surface and a bottom surface of the protruding portion;
    wherein a pad is formed between the first insulating film and the bump electrode; and
    wherein the second hole does not reach the pad.

12. The semiconductor device according to claim 11, wherein a protective insulating film is formed at a boundary portion between the bump electrode and the semiconductor substrate so that the bump electrode and the semiconductor substrate are electrically insulated to each other.

13. The semiconductor device according to claim 11, wherein, in a planar view, a shape of a perimeter of the second hole is circular and a shape of the bump electrode is polygonal.

14. The semiconductor device according to claim 11, wherein, in a planar view, a shape of a perimeter of the second hole is polygonal and a shape of the bump electrode is circular.

15. The semiconductor device according to claim 11, wherein the bump electrode has a shape in which a sidewall has an inclination at a portion exposed above the second insulating film.

16. The semiconductor device according to claim 15, wherein the bump electrode has an inclination at an angle greater than or equal to 45 degrees to less than 70 degrees at a portion exposed above the second insulating film.

17. The semiconductor device according to claim 15, wherein the bump electrode has an inclination at an angle greater than or equal to 70 degrees to less than 90 degrees at a portion exposed above the second insulating film.

18. The semiconductor device according to claim 11,
    wherein the bump electrode includes a first seed layer and a first metal film,
    wherein the first seed layer includes Ti or TiW, and
    wherein the first metal film includes Au, Cu, Al or Ni.

19. The semiconductor device according to claim 18,
    wherein the conductive film includes a second seed layer and a second metal film,
    wherein the second seed layer includes Ti and Au, or Cr and Au, and
    wherein the second metal film includes Au, Cu, Al or Ni.

* * * * *